US011804498B2

(12) United States Patent
Kawasaki et al.

(10) Patent No.: US 11,804,498 B2
(45) Date of Patent: Oct. 31, 2023

(54) METHOD OF MANUFACTURING DISPLAY DEVICE AND DISPLAY DEVICE

(71) Applicant: SHARP KABUSHIKI KAISHA, Sakai (JP)

(72) Inventors: Tatsuya Kawasaki, Sakai (JP); Tohru Daitoh, Sakai (JP); Hajime Imai, Sakai (JP); Hideki Kitagawa, Sakai (JP); Yoshihito Hara, Sakai (JP); Masaki Maeda, Sakai (JP); Yoshiharu Hirata, Sakai (JP); Teruyuki Ueda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/880,294

(22) Filed: May 21, 2020

(65) Prior Publication Data

US 2020/0381463 A1 Dec. 3, 2020

(30) Foreign Application Priority Data

May 29, 2019 (JP) .................. 2019-100132

(51) Int. Cl.
*H01L 27/12* (2006.01)

(52) U.S. Cl.
CPC ........ *H01L 27/1288* (2013.01); *H01L 27/124* (2013.01); *H01L 27/1262* (2013.01)

(58) Field of Classification Search
CPC .................. H01L 27/1288; G02F 1/13338
See application file for complete search history.

(56) References Cited

U.S. PATENT DOCUMENTS

| 6,353,464 B1* | 3/2002 | Noumi ............. G02F 1/136227 349/42 |
| 2004/0109101 A1* | 6/2004 | Kim .................. G02F 1/136209 349/44 |
| 2005/0255622 A1* | 11/2005 | Kokura ............. G02F 1/136227 438/30 |
| 2006/0132701 A1* | 6/2006 | Minowa .............. G02F 1/1333 349/187 |
| 2013/0112978 A1* | 5/2013 | Hoka ............... G02F 1/136286 257/59 |
| 2013/0162570 A1* | 6/2013 | Shin .................. G02F 1/13338 345/173 |

(Continued)

FOREIGN PATENT DOCUMENTS

| JP | 2016-126778 A | 7/2016 |
| JP | 2017102455 A | 6/2017 |

*Primary Examiner* — Peter M Albrecht
(74) *Attorney, Agent, or Firm* — ScienBiziP, P.C.

(57) ABSTRACT

The present invention has an object to reduce the number of necessary masks to reduce manufacturing cost. A method of manufacturing a display device includes: forming electrodes or first lines; forming a first insulating film covering the electrodes or the first lines; forming a second insulating film covering the first insulating film; collectively forming first contact holes through the first insulating film and the second insulating film so as to expose parts of the electrodes or parts of the first lines; planarizing a surface of the second insulating film; and forming a first conductive layer to be connected from the surface of the second insulating film to the exposed parts of the electrodes or the exposed parts of the first lines via the first contact holes.

5 Claims, 12 Drawing Sheets

(56) References Cited

U.S. PATENT DOCUMENTS

| | | | |
|---|---|---|---|
| 2015/0091014 A1* | 4/2015 | Hong | H01L 27/1248 |
| | | | 438/158 |
| 2016/0188040 A1 | 6/2016 | Shin et al. | |
| 2017/0153747 A1 | 6/2017 | Yoon et al. | |
| 2017/0176798 A1* | 6/2017 | Ahn | G02F 1/13338 |
| 2017/0269739 A1 | 9/2017 | Shin et al. | |

* cited by examiner

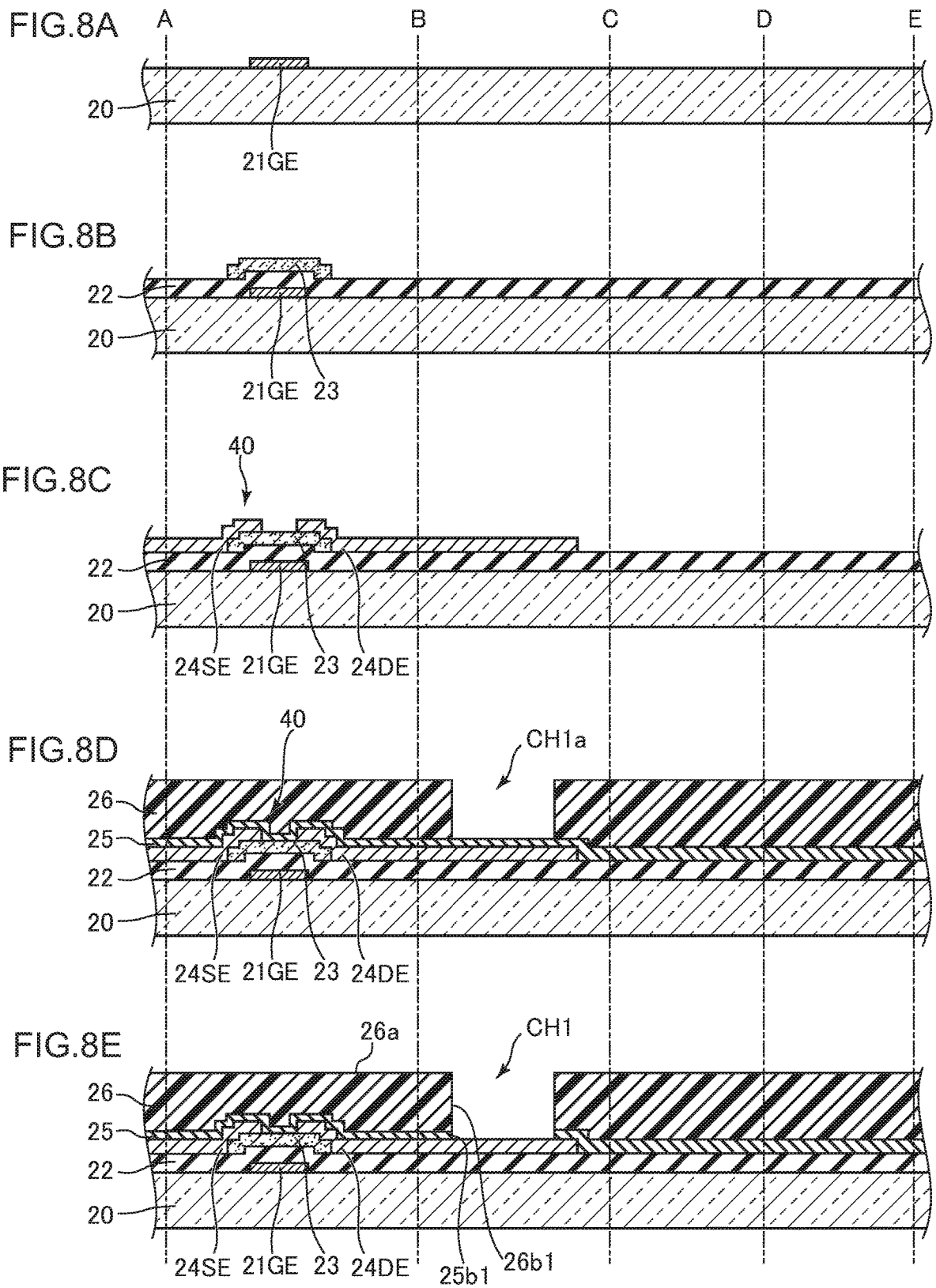

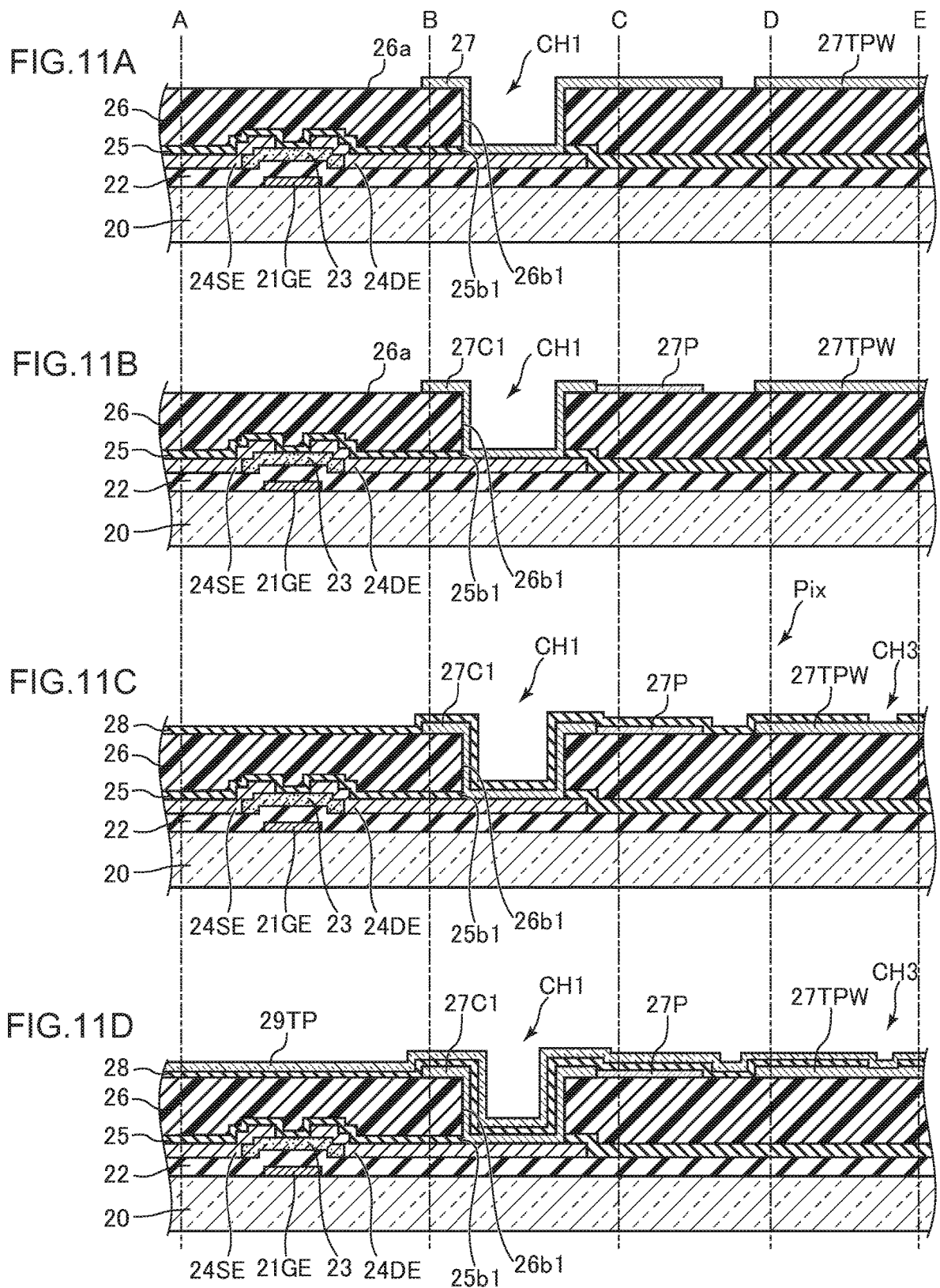

METHOD OF MANUFACTURING DISPLAY DEVICE AND DISPLAY DEVICE

CROSS-REFERENCE TO RELATED APPLICATION

The present application claims priority from Japanese Application JP2019-100132, the content to which is hereby incorporated by reference into this application.

FIELD OF THE INVENTION

The present invention, in an aspect thereof, relates to a method of manufacturing a display device and a display device.

BACKGROUND OF THE INVENTION

Japanese Unexamined Patent Application Publication, Tokukai, No. 2016-126778 discloses a touch-sensor-integrated display device including a second protective film (PAS2) and a third protective film (PAS3) on 1-2 routing wires (TW12) and 1-2 touch/common electrodes (Tx12) on the third protective film (PAS3). The 1-2 touch/common electrodes (Tx12) function as common electrodes in driving the display device and as touch electrodes in driving the touch panel. The 1-2 touch/common electrodes (Tx12) are connected to the 1-2 routing wires (TW12) via third contact holes (CH12) extending through the second protective film (PAS2) and the third protective film (PAS3).

SUMMARY OF THE INVENTION

Problems to be Solved by the Invention

Japanese Unexamined Patent Application Publication, Tokukai, No. 2016-126778 does not disclose a method of forming the third contact holes (CH12) extending through the second protective film (PAS2) and the third protective film (PAS3). Many masks will be needed at an extra manufacturing cost if the third contact holes (CH12) are formed by using a mask to form contact holes through the second protective film (PAS2) and using another mask to form contact holes through the third protective film (PAS3).

The present invention, in an aspect thereof, has an object to reduce the number of necessary masks to reduce manufacturing cost.

Solution to the Problems

The present invention, in an aspect thereof, is directed to a method of manufacturing a display device, the method including: forming first lines; forming a first insulating film covering the first lines; forming a second insulating film covering exposed parts of the first insulating film; collectively forming first contact holes through the first insulating film and the second insulating film so as to expose parts of the first lines; and forming a first conductive layer to be connected to the exposed parts of the first lines via the first contact holes.

The present invention, in an aspect thereof, is directed to a display device including: first lines; a first insulating film covering the first lines; a second insulating film covering at least parts of the first insulating film; and a first conductive layer connected, via first contact holes formed through the first insulating film and the second insulating film, to the first lines in the first contact holes, wherein a first inner wall that is an inner wall of the first insulating film and a second inner wall that is an inner wall of the second insulating film lie in a single continuous face in each first contact hole, the first inner wall and the second inner wall constituting parts of an inner wall of the first contact hole.

Advantageous Effects of the Invention

The present invention, in an aspect thereof, can suppress surface irregularities of a plurality of insulating films and collectively form contact holes through the insulating films.

BRIEF DESCRIPTION OF DRAWINGS

FIG. 8A, FIG. 8B, FIG. 8C, FIG. 8D, and FIG. 8E illustrate steps S11 to S18 shown in FIG. 7 in a formation area for a display area of an array substrate in accordance with an embodiment.

FIG. 11A, FIG. 11B, FIG. 11C, and FIG. 11D illustrate steps S19 to S23 shown in FIG. 7 in a formation area for a display area of an array substrate in accordance with an embodiment.

DESCRIPTION OF EMBODIMENTS

Embodiments

Figure 1:
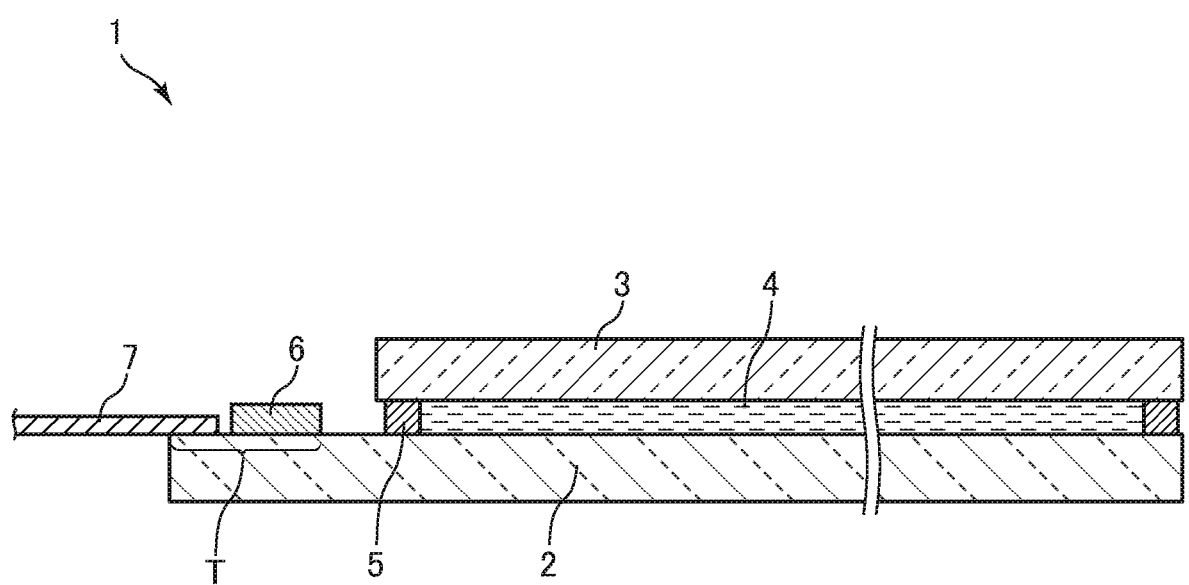
FIG. 1 is a schematic cross-sectional view of a structure of a display device in accordance with an embodiment.

The following will describe illustrative embodiments of the present invention in reference to drawings. FIG. 1 provides a reference for the "up/down" directions: the top end of FIG. 1 indicates the upward direction whilst the bottom end of FIG. 1 indicates the downward direction.

These definitions of directions are for convenience of description only and not intended to limit the orientation of the display device in accordance with the present invention during the manufacture or use thereof. The same reference numerals in the drawings denote identical or equivalent members, and their description is omitted.

FIG. 1 is a schematic cross-sectional view of a structure of a display device 1 in accordance with an embodiment. The display device 1 constitutes, for example, a liquid crystal panel that has a touch panel function, as well as a display function. The display device 1 produces image displays by using the light emitted by a backlight device (not shown). The display device 1 may be a liquid crystal panel and may alternatively be an OLED (organic light emitting diode) panel, a QLED (quantum dot light emitting diode) panel, or another panel capable of producing image displays.

The display device 1, in the present embodiment, includes an array substrate 2, an opposite substrate 3, a liquid crystal layer 4, a sealing section 5, a driver 6, and a circuit board 7.

The array substrate 2 is disposed over the backlight device. The array substrate 2 is disposed opposite the opposite substrate 3 across the liquid crystal layer 4. The array substrate 2 is larger than the opposite substrate 3. The array substrate 2 includes TFTs and various wiring both formed on a surface thereof facing the opposite substrate 3. These TFTs and wiring will be detailed later. There is provided a terminal section T along an edge of the array substrate 2 on a part of a surface of the array substrate 2 facing the opposite substrate 3, the part not overlapping the opposite substrate 3.

The opposite substrate 3 includes, for example, a color filter (not shown) and a black matrix (not shown) both formed on a surface thereof facing the array substrate 2. The array substrate 2 and the opposite substrate 3 are made of, for example, translucent glass. There is provided a first polarizer (not shown) on a surface of the array substrate 2 opposite the surface thereof facing the opposite substrate 3. There is provided a second polarizer (not shown) on a surface of the opposite substrate 3 opposite the surface thereof facing the array substrate 2. The first and second polarizers are arranged in a crossed-Nicol position in which their polarization axes are orthogonal to each other.

The liquid crystal layer 4 is disposed between the array substrate 2 and the opposite substrate 3. The liquid crystal layer 4 contains liquid crystal molecules that change their optical properties under an applied electric field. The sealing section 5 is disposed surrounding the liquid crystal layer 4 between the array substrate 2 and the opposite substrate 3, in order to adhere the array substrate 2 and the opposite substrate 3 together along their edges to form a frame-like structure. The sealing section 5 is composed of, for example, a photocuring resin such as an ultraviolet curing resin.

Both the driver 6 and the circuit board 7 are disposed in the terminal section T of the array substrate 2. The driver 6 and the circuit board 7 are mounted to the terminal section T of the array substrate 2 by, for example, COG (chip-on-glass) technology for connection to a plurality of terminals (detailed later) of the terminal section T. The driver 6 is built around, for example, an LSI chip that includes a driver circuit therein. The driver 6 processes, for example, various signals fed from the circuit board 7.

The circuit board 7 includes a base member and numerous wiring patterns (not shown) formed on the base member. The base member is composed of, for example, an electrically insulating and flexible synthetic resin material (e.g., a polyimide-based resin). The circuit board 7 has an end thereof connected to the terminal section T of the array substrate 2 and the other end thereof connected to a control board (not shown) serving as a signal supply source. The various signals supplied from the control board are transferred to the array substrate 2 via the circuit board 7 and processed by the driver 6 for subsequent output to a display area DA (see FIG. 2) where images are displayed.

Figure 2:
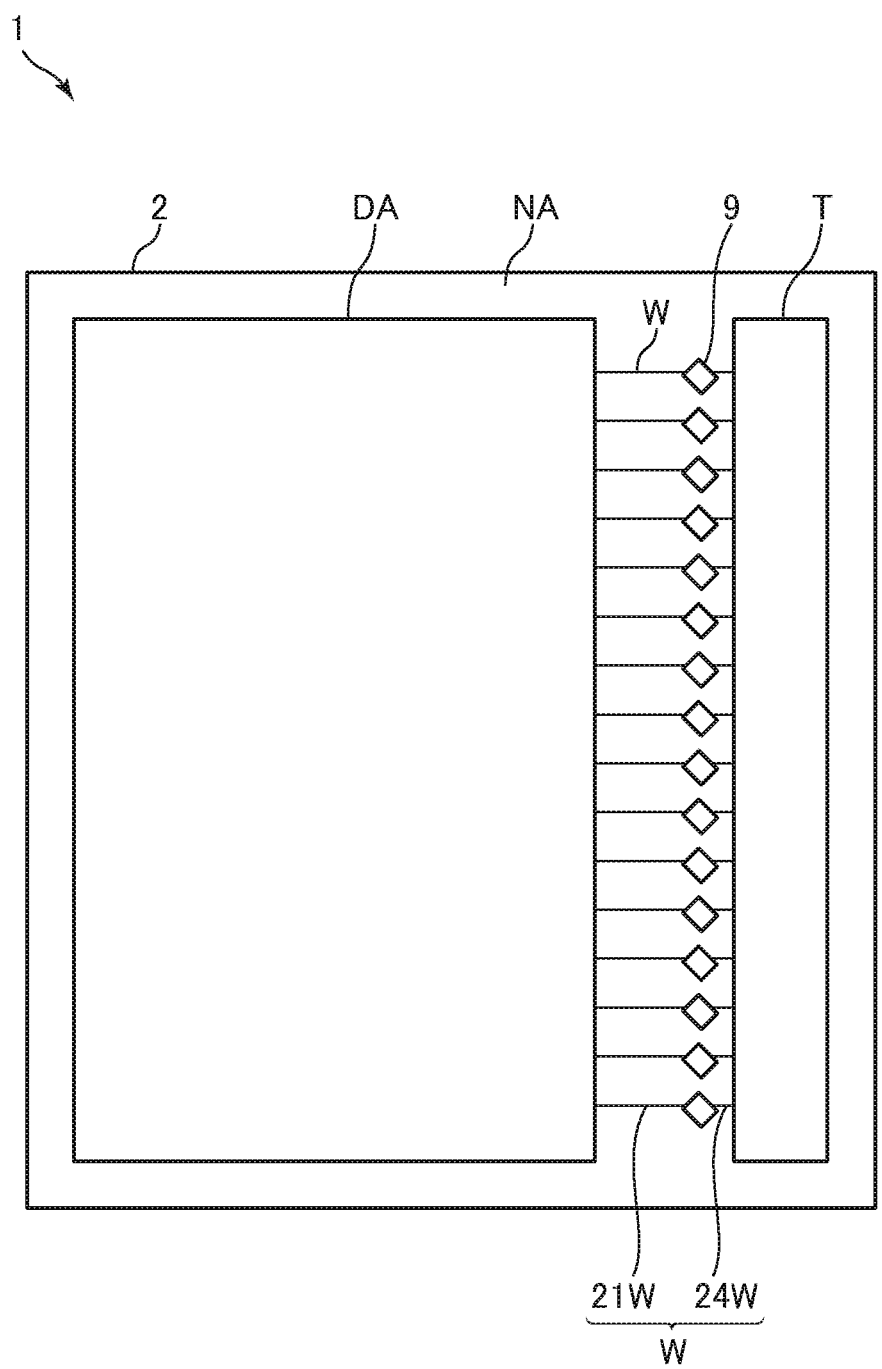
FIG. 2 is a schematic top view of a display device, illustrating a layout of wires on an array substrate in accordance with the present embodiment.

FIG. 2 is a schematic top view of the display device 1, illustrating a layout of wires on the array substrate 2 in accordance with the present embodiment. Referring to FIG. 2, the array substrate 2 provides, in the center thereof, the display area DA where the display device 1 produces image displays. The array substrate 2 also provides, in the peripheral portion thereof that surrounds the display area DA, a non-display area (frame region NA) where the display device 1 does not produce image displays. There is provided a plurality of routing lines W in a part of the frame region NA of the array substrate 2 that resides outside the opposite substrate 3 in a plan view (in other words, a part of the frame region NA that does not overlap the opposite substrate 3 in a plan view). Each routing line W is connected at an end thereof to a different wire in the display area DA and at the other end thereof to a different terminal of the terminal section T. Each routing line W includes: a first line 21W and a second line 24W in different layers; and a switching contact section 9 connecting the first line 21W to the second line 24W via a contact hole (details will be given later).

Figure 3:
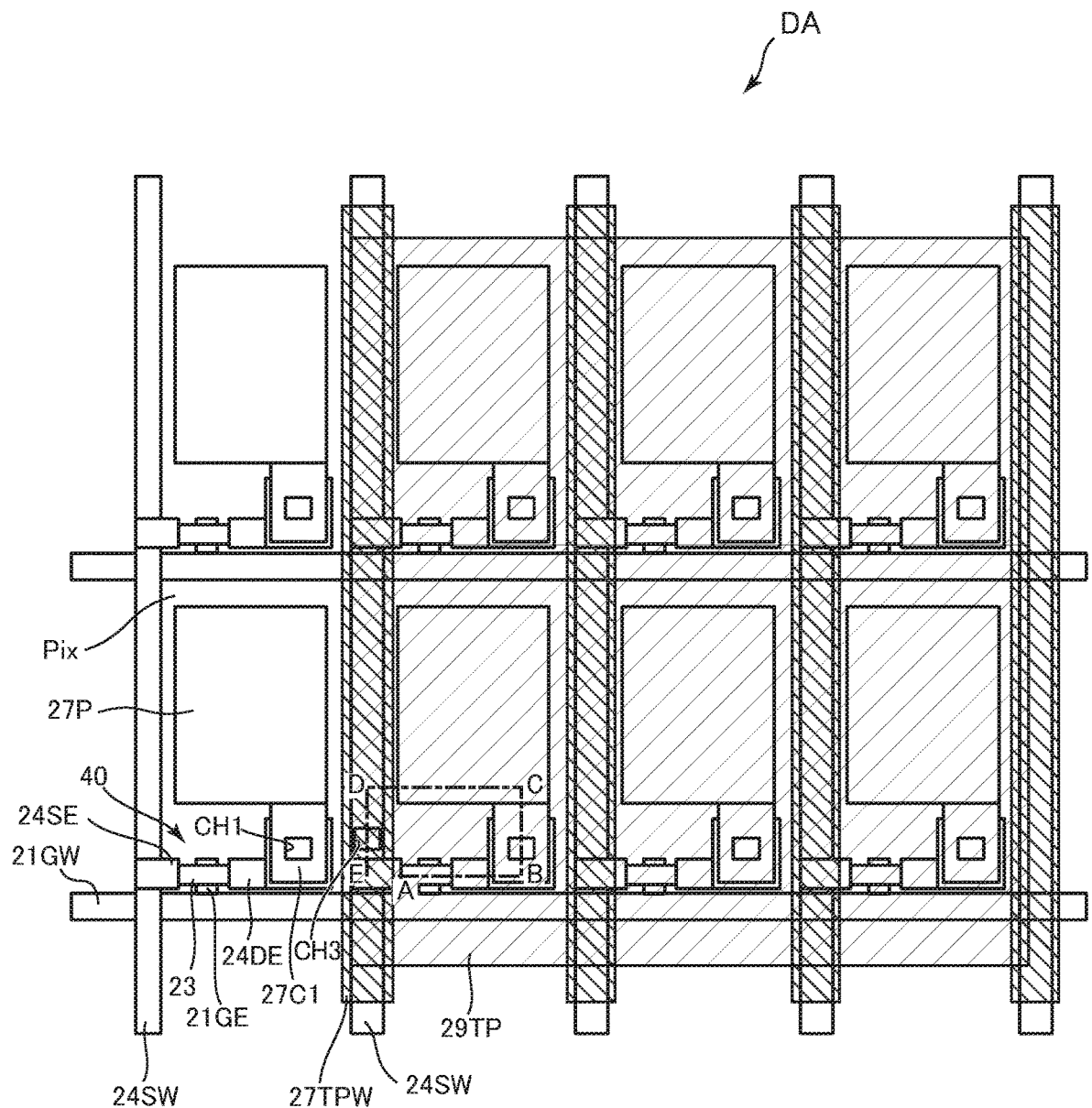
FIG. 3 is an enlarged top view of a part of a display area of an array substrate in accordance with an embodiment.

FIG. 3 is an enlarged top view of a part of the display area DA of the array substrate 2. There are provided a plurality of gate lines 21GW (scan lines) and a plurality of source lines 24SW (signal lines, data lines) on the surface of the display area DA of the array substrate 2 in such a manner that the gate lines 21GW and the source lines 24SW intersect with each other. There is also provided a plurality of touch panel lines 27TPW in the display area DA of the array substrate 2. For instance, the gate lines 21GW extend in the left and right direction in FIG. 3, so as to traverse the display area DA in a widthwise direction. The touch panel lines 27TPW run parallel to the gate lines 21GW or the source lines 24SW. For instance, the source lines 24SW and the touch panel lines 27TPW extend in the up and down direction in FIG. 3, so as to traverse the display area DA in a lengthwise direction. The touch panel lines 27TPW overlap the respective source lines 24SW in the example shown in FIG. 3.

Each gate line 21GW is connected to a gate driver (not shown) at an end thereof. Each source line 24SW is connected to a source driver (not shown) at an end thereof. The gate driver outputs gate signals to the gate lines 21GW. The source driver outputs source signals to the source lines 24SW. The gate and source drivers are located on the top face of the array substrate 2 along the periphery of the display area DA. The gate and source drivers may be provided as a part of the driver 6 (see FIG. 1). Each touch panel line 27TPW is connected to a different terminal of the terminal section T at an end thereof. The gate lines GW, the source lines SW, and the touch panel lines TPW may be respectively connected to the terminals of the terminal section T via the routing lines W (see FIG. 2).

A matrix of pixel regions Pix is provided in the display area DA of the array substrate 2. The pixel regions Pix are regions on the array substrate 2 that serve as pixels. For instance, each pixel region Pix is a region surrounded by one of the gate lines 21GW and one of the source lines 24SW.

There are provided a TFT 40, a pixel electrode 27P, and a first connecting section 27C1 in the pixel region Pix. The TFT 40 is provided near an intersecting portion of the gate line 21GW and the source line 24SW and serves as a switching element for controlling the driving of the pixel electrode 27P. The TFT 40 has a gate electrode 21GE, a source electrode 24SE, and a drain electrode 24DE. The gate electrode 21GE is connected to the gate line 21GW, and the source electrode 24SE is connected to the source line 24SW. The drain electrode 24DE is connected to the first connecting section 27C1 via a contact hole CH1 and to the pixel electrode 27P via the first connecting section 27C1.

There are provided touch panel electrode sections (first conductive layer) 29TP with a plurality of slits (openings) in a layer above the pixel electrodes 27P. Each touch panel electrode section 29TP is provided over some pixel regions Pix. The touch panel electrode section 29TP serves as a common electrode when the display device 1 is driven as a display device and as a touch-detecting touch electrode when the display device 1 is driven as a touch panel. There is provided a contact hole CH3 in a part of the touch panel electrode section 29TP that overlaps the touch panel line TPW. The touch panel electrode section 29TP is connected to the touch panel line (second conductive layer) 27TPW via the contact hole CH3. FIG. 3 shows an example where the touch panel electrode section 29TP does not cover some pixel regions Pix, and the touch panel line TPW does not cover some source lines 24SW. Alternatively, the touch panel electrode section 29TP may cover all the pixel regions Pix, and the touch panel lines TPW may cover all the source lines 24SW.

The pixel electrode 27P is connected to the first connecting section (second conductive layer) 27C1. The first connecting section 27C1 is connected to the drain electrode 24DE via the contact hole CH1. The drain electrode 24DE is located below the first connecting section 27C1. In other words, the pixel electrode 27P is connected to the drain electrode 24DE via the first connecting section 27C1 and the contact hole CH1.

The pixel electrodes 27P are transparent electrodes. Each pixel electrode 27P is placed at an electrical potential that is in accordance with a data signal supplied via the TFT 40 located in the same pixel region Pix, to generate an electrical potential difference between the pixel electrode 27P and the common electrode. The electrical potential difference rotates the liquid crystal molecules in the liquid crystal layer 4. This mechanism controls the liquid crystal layer 4 to transmit or block light. The display device 1 may include a liquid crystal panel that operates in FFS (fringe field switching) mode, IPS (in-plane switching) mode, or any other driving mode.

The gate electrodes 21GE and the gate lines 21GW are formed of the same metal material, in the same step, and by using a first mask, as will be described later in detail. A metal layer (e.g., electrodes and wiring) that is formed of the same metal material and in the same step as the gate electrodes 21GE and the gate lines 21GW and by using the first mask may be referred to as a first metal layer. Likewise, the source electrodes 24SE, the drain electrodes 24DE, and the source lines 24SW are formed of the same metal material, in the same step, and by using a third mask. A metal layer (e.g., electrodes and wiring) that is formed of the same metal material and in the same step as the source electrodes 24SE, the drain electrodes 24DE, and the source lines 24SW and by using the third mask may be referred to as a second metal layer. The first connecting sections 27C1 are a stack of metal films of different metal materials. The pixel electrodes 27P are parts of the multilayered metal films constituting the first connecting sections 27C1. The first connecting sections 27C1 are formed using a fifth mask. A metal layer (e.g., wiring) that is formed of the same metal material and in the same step as the first connecting sections 27C1 and by using the fifth mask may be referred to as a third metal layer (second conductive layer).

Figure 4:
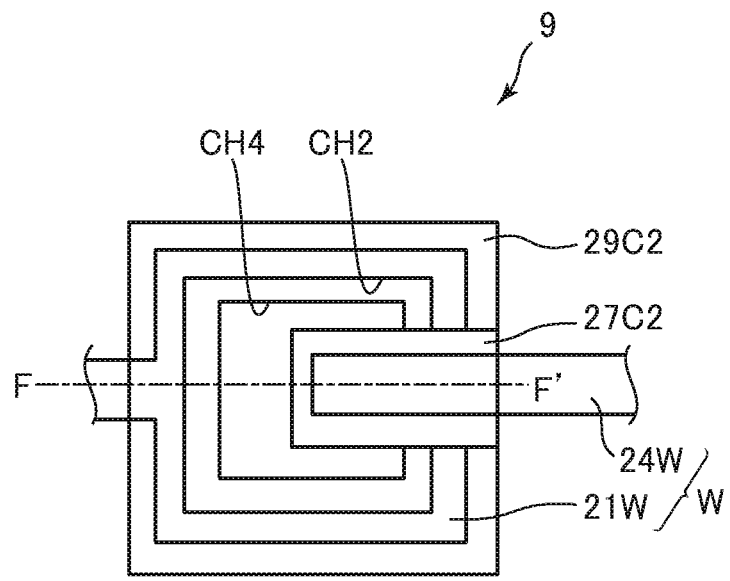
FIG. 4 is a top view of a switching contact section on an array substrate in accordance with an embodiment.

FIG. 4 is a top view of the switching contact section 9 on the array substrate 2 in accordance with an embodiment. The switching contact section 9 is provided in the path of the routing line W from the display area DA to the terminal section T. The first line 21W and the second line 24W of the routing line W are formed such that their ends overlap. The switching contact section 9 has a contact hole CH2 through a first protective film 25 (see, for example, FIG. 12D) and a planarizing film 26 (see, for example, FIG. 12D) and a contact hole CH4 through a gate insulating film 22 and a second protective film 28. In the switching contact section 9 are there provided a second connecting section 29C2 stretching in the contact hole CH2 and the contact hole CH4 and a metal cover 27C2 over the contact hole CH2. The first line 21W and the second line 24W are connected at their ends in the switching contact section 9 via the second connecting section 29C2 and the metal cover 27C2.

The first line 21W, the second line 24W, the second connecting section 29C2, and the metal cover 27C2 are provided in different metal layers. The cross-sectional structure of the switching contact section 9, together with the method of manufacturing the switching contact section 9, will be described later with reference to FIGS. 9A to 9E and 12A to 12D.

Figure 5:
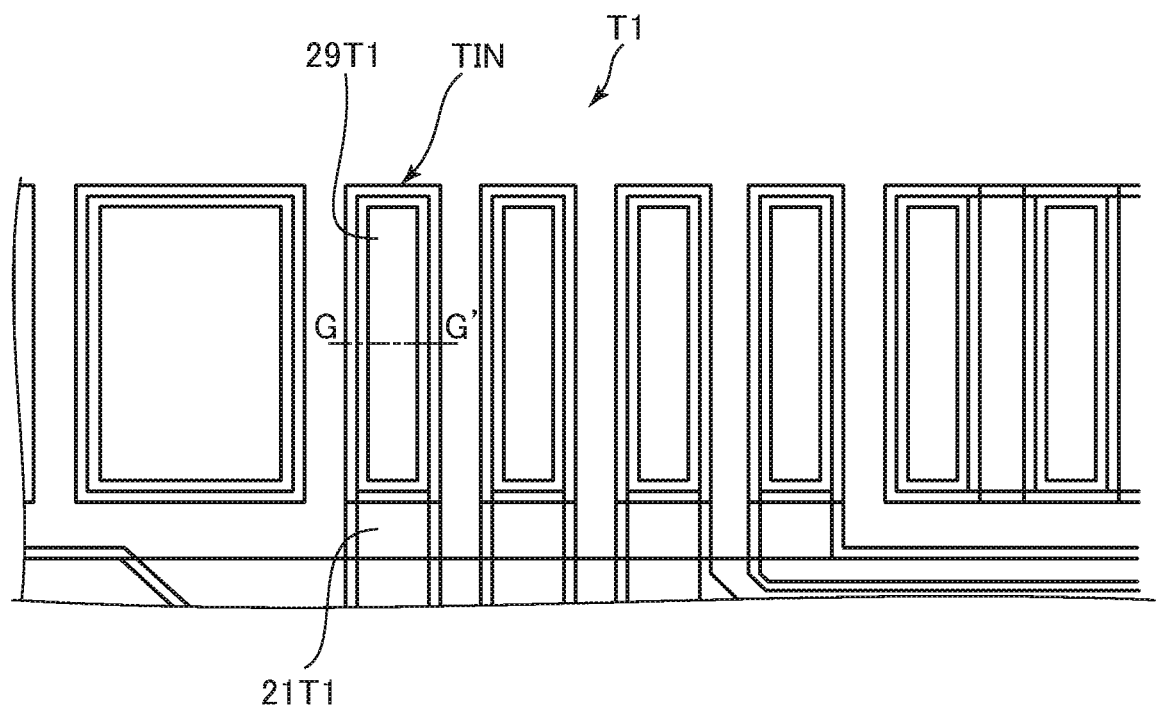
FIG. 5 is a top view of an input terminal portion of a terminal section of an array substrate in accordance with an embodiment.

FIG. 5 is a top view of an input terminal portion T1 of the terminal section T of the array substrate 2 in accordance with an embodiment. The input terminal portion T1 has a plurality of input terminals TIN arranged next to each other for receiving inputs of various signals from the driver 6, the circuit board 7, and other circuit components mounted to the input terminal portion T1. Each input terminal TIN includes an input terminal pad 29T1 and an input terminal line 21T1. The input terminal pad 29T1 is electrically connected to terminals of the driver 6, the circuit board 7, and other circuit components mounted to the input terminal portion T. The input terminal line 21T1 outputs various signals fed to the input terminal pad 29T1. The input terminal line 21T1 may be connected at an end thereof to the input terminal pad 29T1 and at the other end thereof either to the routing line W or to various lines formed in the display area DA via other wiring.

Figure 6:
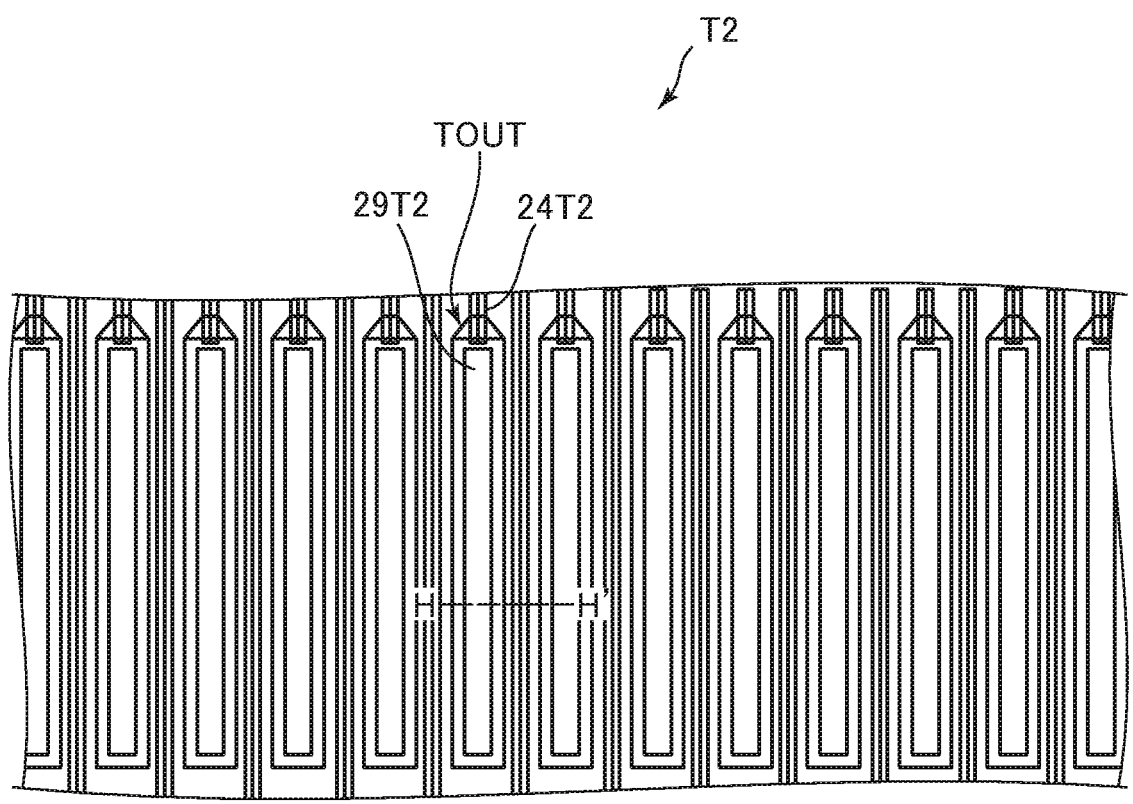
FIG. 6 is a top view of an output terminal portion of a terminal section of an array substrate in accordance with an embodiment.

FIG. 6 is a top view of an output terminal portion T2 of the terminal section T of the array substrate 2 in accordance with an embodiment. The output terminal portion T2 has a plurality of output terminals TOUT arrange next to each other for outputting various signals to the circuit board 7 and other circuit components mounted to the output terminal portion T2. Each output terminal TOUT includes an output terminal pad 29T2 and an output terminal line 24T2. The output terminal pad 29T2 is electrically connected to terminals of the circuit board 7 and other circuit components mounted to the output terminal portion T2. The output terminal line 24T2 outputs various signals fed from the output terminal pad 29T2. The output terminal line 24T2 may be connected at an end thereof to the output terminal pad 29T2 and at the other end thereof either to the routing line W or to various lines formed in the display area DA via other wiring.

Figure 7:
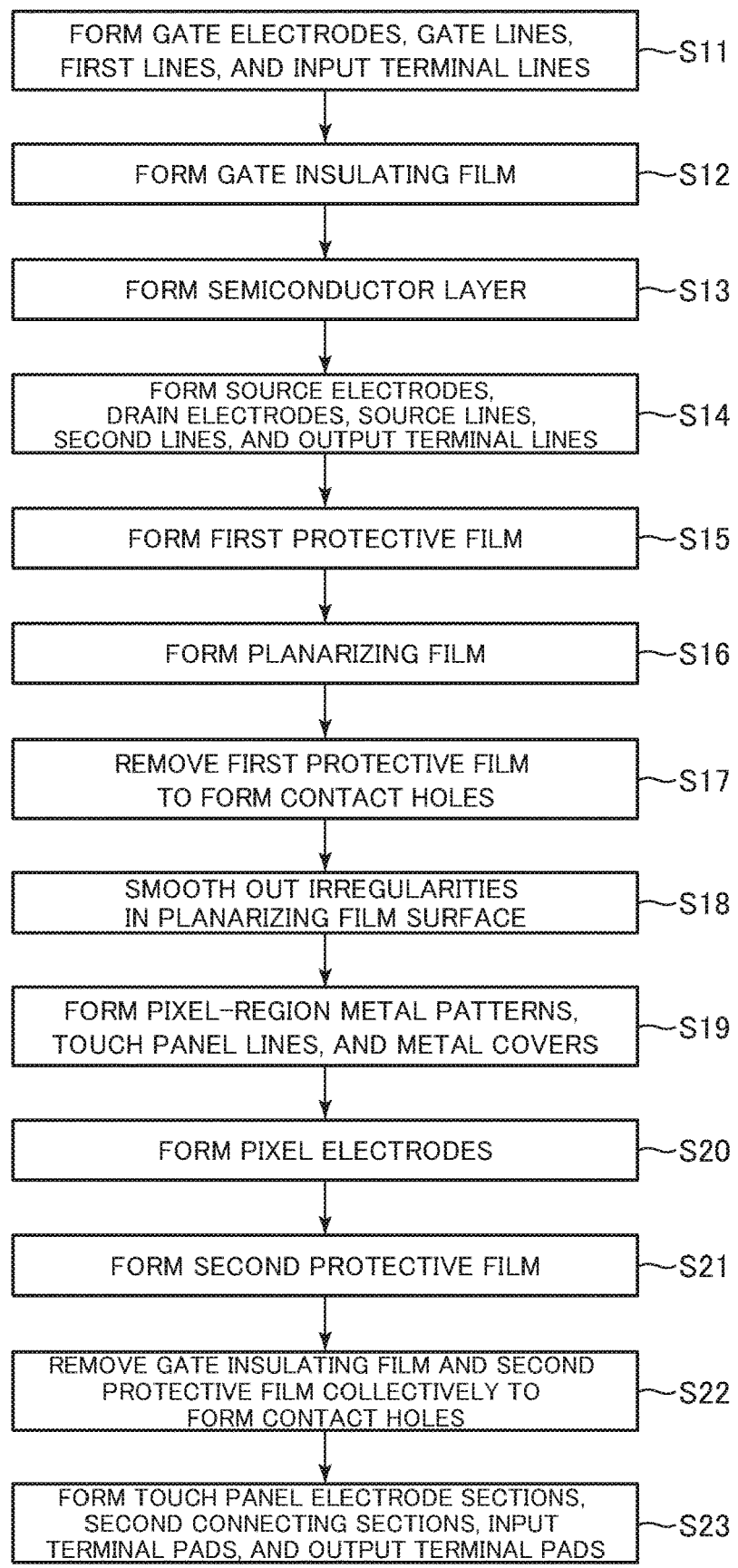
FIG. 7 is a flow diagram of manufacturing steps for an array substrate in accordance with an embodiment.

A description will be given next of an exemplary method of manufacturing the display device 1 with reference to FIG. 7 to FIGS. 13A to D. FIG. 7 is a flow diagram of manufacturing steps for the array substrate 2 in accordance with an embodiment. FIGS. 8A to 8E and 11A to 11D illustrate manufacturing steps for the display area DA of the array substrate 2 in accordance with an embodiment. FIGS. 8A to 8E and 11A to 11D illustrate a manufacturing process by way of cross-sectional views taken along ABCDE in FIG. 3.

FIGS. 9A to 9E and 12A to 12D illustrate manufacturing steps for the routing lines W on the array substrate 2 in accordance with an embodiment. FIGS. 9A to 9E and 12A to 12D illustrate a manufacturing process, in particular, in the vicinity of the switching contact section 9 on the routing line W. FIGS. 9A to 9E and 12A to 12D illustrate a manufacturing process by way of cross-sectional views taken along F-F' in FIG. 4.

FIGS. 10A to 10E and 13A to 13D illustrate manufacturing steps for the input terminal portion T1 and the output terminal portion T2 on the array substrate 2 in accordance with an embodiment. FIGS. 10A to 10E and 13A to 13D illustrate a manufacturing process for the input terminal portion T1 on the left by way of cross-sectional views taken along G-G' in FIG. 5 and a manufacturing process for the output terminal portion T2 on the right by way of cross-sectional views taken along H-H' in FIG. 6.

Specifically, FIGS. 8A to 8E illustrate steps S11 to S18 shown in FIG. 7 in a formation area for a display area of an array substrate in accordance with an embodiment. FIG. 8A illustrates step S11 shown in FIG. 7 in a formation area for the display area DA. FIG. 8B illustrates steps S12 and S13 shown in FIG. 7 in the formation area for the display area DA. FIG. 8C illustrates step S14 shown in FIG. 7 in the formation area for the display area DA. FIG. 8D illustrates steps S15 and S16 shown in FIG. 7 in the formation area for the display area DA. FIG. 8E illustrates steps S17 and S18 shown in FIG. 7 in the formation area for the display area DA.

Figure 9A:
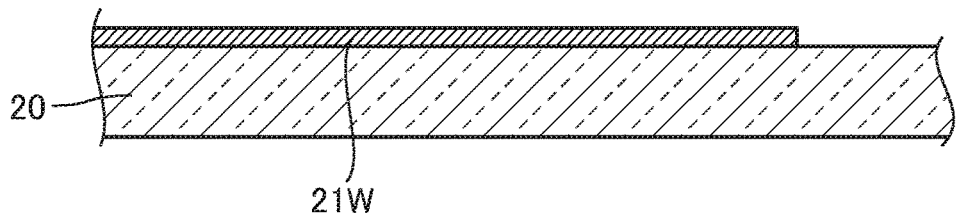
FIG. 9A, FIG. 9B, FIG. 9C, FIG. 9D, and FIG. 9E illustrate steps S11 to S18 shown in FIG. 7 in a formation area for routing lines on an array substrate in accordance with an embodiment.
Figure 9B:
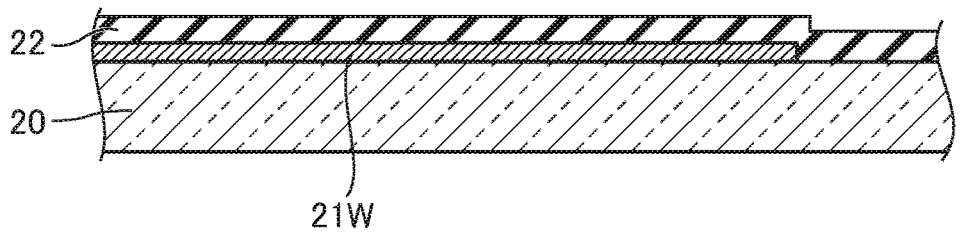
Figure 9C:
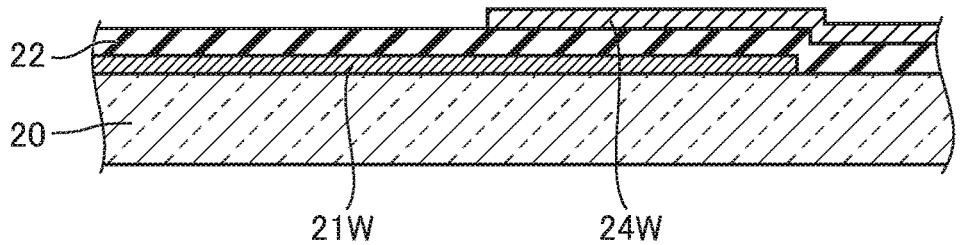
Figure 9D:
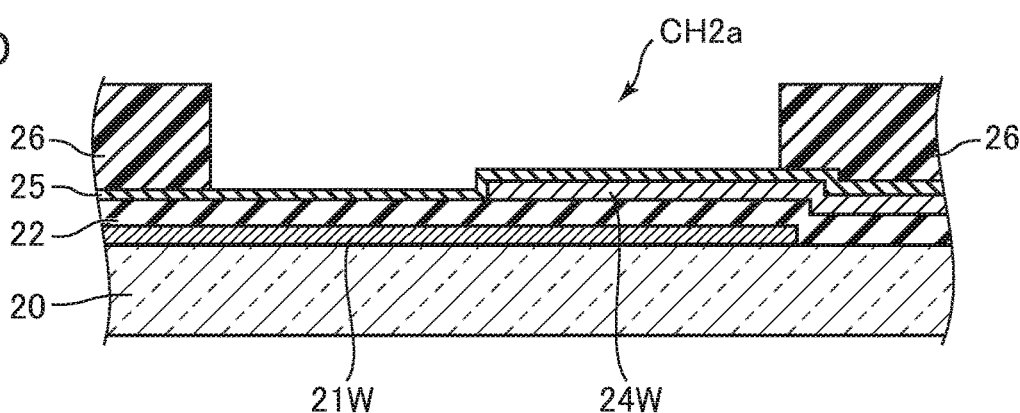
Figure 9E:
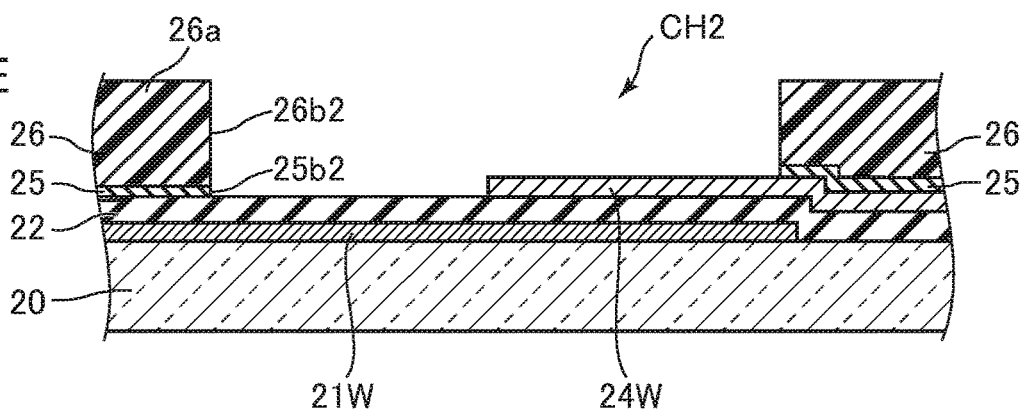

FIGS. 9A to 9E illustrate steps S11 to S18 shown in FIG. 7 in a formation area for routing lines on an array substrate in accordance with an embodiment. FIG. 9A illustrates step S11 shown in FIG. 7 in a formation area for the routing lines W. FIG. 9B illustrates steps S12 and S13 shown in FIG. 7 in the formation area for the routing lines W. FIG. 9C illustrates step S14 shown in FIG. 7 in the formation area for the routing lines W. FIG. 9D illustrates steps S15 and S16 shown in FIG. 7 in the formation area for the routing lines W. FIG. 9E illustrates steps S17 and S18 shown in FIG. 7 in the formation area for the routing lines W.

Figure 10A:
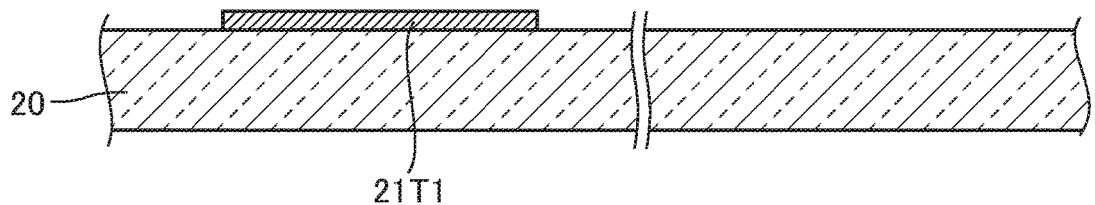
FIG. 10A, FIG. 10B, FIG. 10C, FIG. 10D, and FIG. 10E illustrate steps S11 to S18 shown in FIG. 7 in a formation area for an input terminal portion and in a formation area for an output terminal portion on an array substrate in accordance with an embodiment.
Figure 10B:
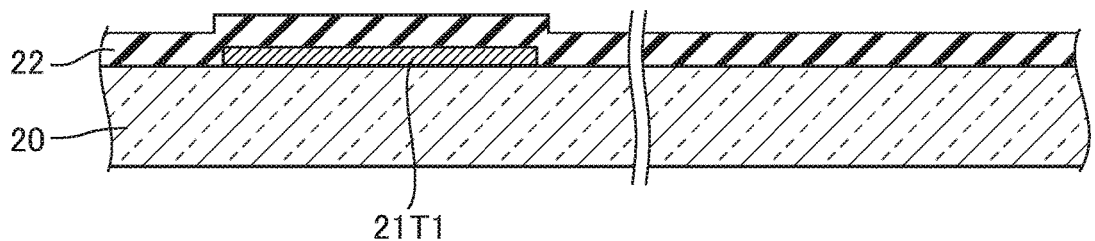
Figure 10C:
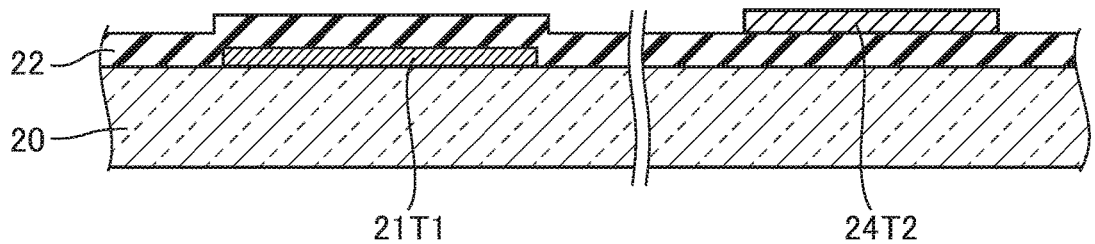
Figure 10D:
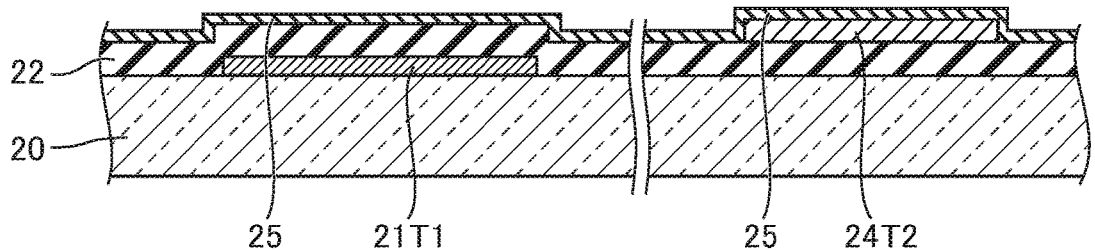
Figure 10E:
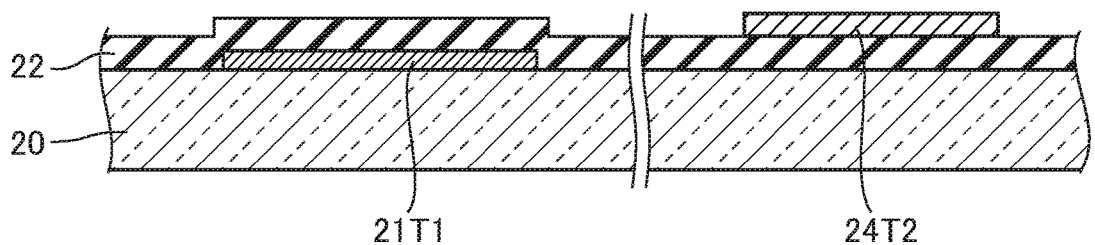

FIGS. 10A to 10E illustrate steps S11 to S18 shown in FIG. 7 in a formation area for an input terminal portion and in a formation area for an output terminal portion on an array substrate in accordance with an embodiment. FIG. 10A illustrates step S11 shown in FIG. 7 in a formation area for the input terminal portion T1 and in a formation area for the output terminal portion T2. FIG. 10B illustrates steps S12 and S13 shown in FIG. 7 in the formation area for the input terminal portion T1 and in the formation area for the output terminal portion T2. FIG. 10C illustrates step S14 shown in FIG. 7 in the formation area for the input terminal portion T1 and in the formation area for the output terminal portion T2. FIG. 10D illustrates steps S15 and S16 shown in FIG. 7 in the formation area for the input terminal portion T1 and in the formation area for the output terminal portion T2. FIG. 10E illustrates steps S17 and S18 shown in FIG. 7 in the formation area for the input terminal portion T1 and in the formation area for the output terminal portion T2.

FIGS. 11A to 11D illustrate steps S19 to S23 shown in FIG. 7 in a formation area for a display area of an array substrate in accordance with an embodiment. FIG. 11A illustrates step S19 shown in FIG. 7 in a formation area for the display area DA. FIG. 11B illustrates step S20 shown in FIG. 7 in the formation area for the display area DA. FIG. 11C illustrates steps S21 and S22 shown in FIG. 7 in the formation area for the display area DA. FIG. 11D illustrates step S23 shown in FIG. 7 in the formation area for the display area DA.

Figure 12A:
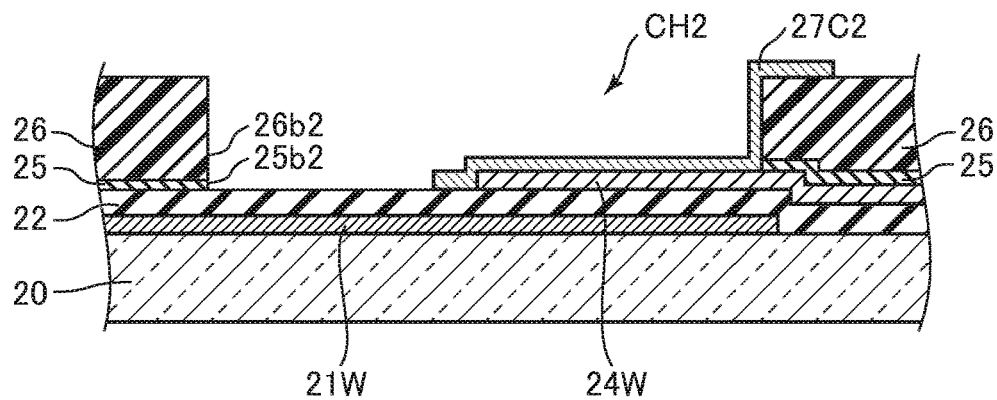
FIG. 12A, FIG. 12B, FIG. 12C, and FIG. 12D illustrate steps S19 to S23 shown in FIG. 7 in a formation area for routing lines on an array substrate in accordance with an embodiment.
Figure 12B:
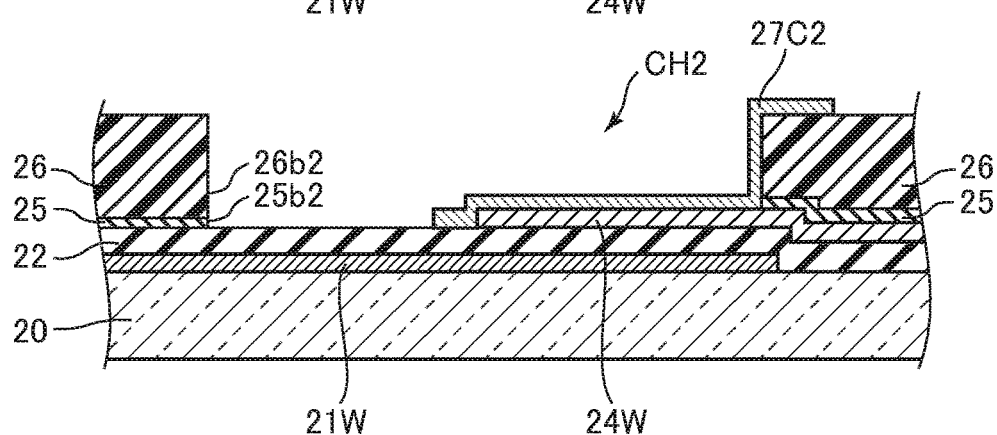
Figure 12C:
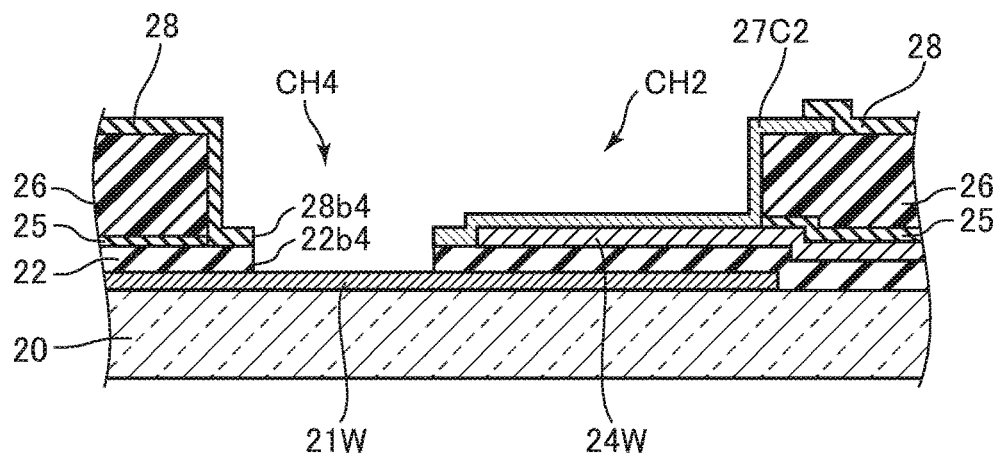
Figure 12D:
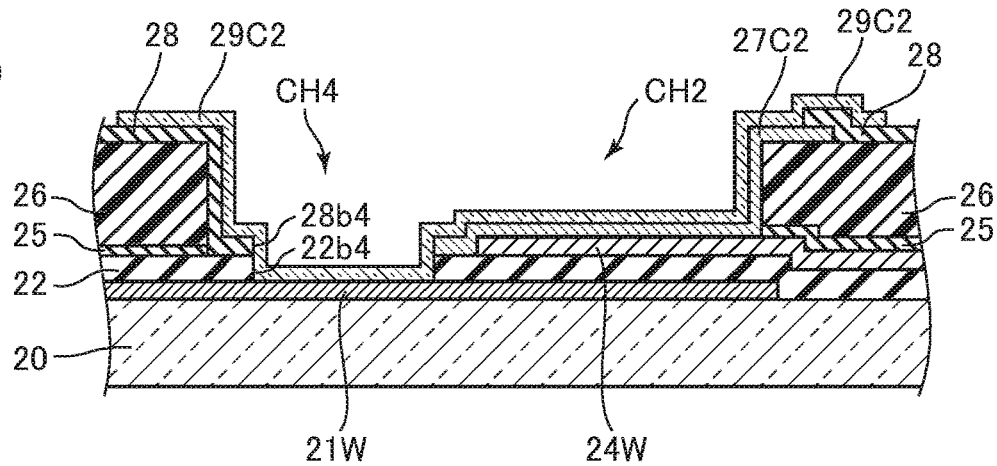

FIGS. 12A to 12D illustrate steps S19 to S23 shown in FIG. 7 in a formation area for routing lines on an array substrate in accordance with an embodiment. FIG. 12A illustrates step S19 shown in FIG. 7 in a formation area for the routing lines W. FIG. 12B illustrates step S20 shown in FIG. 7 in the formation area for the routing lines W. FIG. 12C illustrates steps S21 and S22 shown in FIG. 7 in the formation area for the routing lines W. FIG. 12D illustrates step S23 shown in FIG. 7 in the formation area for the routing lines W.

Figure 13A:
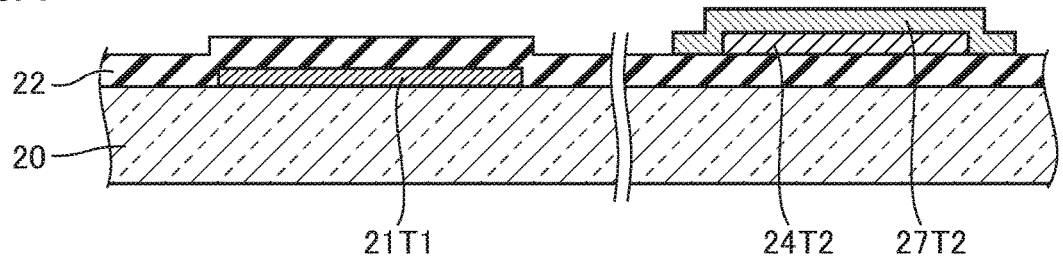
FIG. 13A, FIG. 13B, FIG. 13C, and FIG. 13D illustrate steps S19 to S23 shown in FIG. 7 in a formation area for an input terminal portion and in a formation area for an output terminal portion on an array substrate in accordance with an embodiment.
Figure 13B:
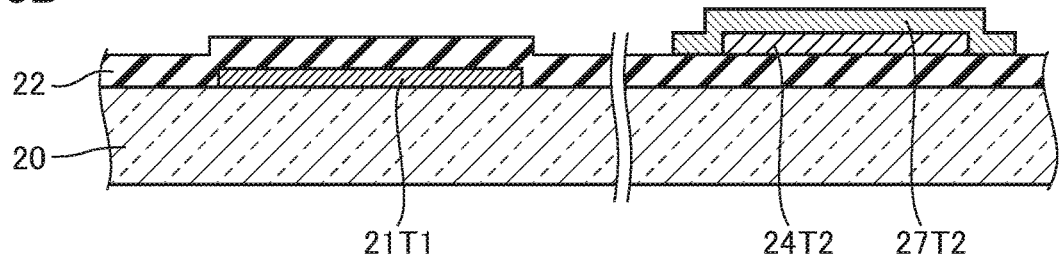
Figure 13C:
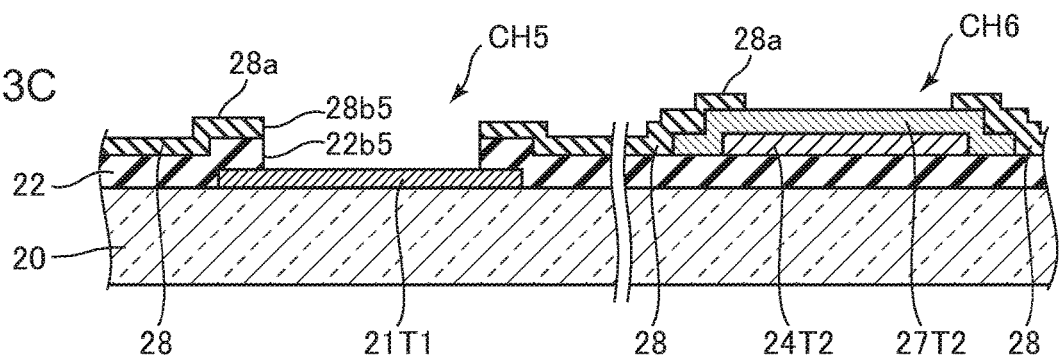
Figure 13D:
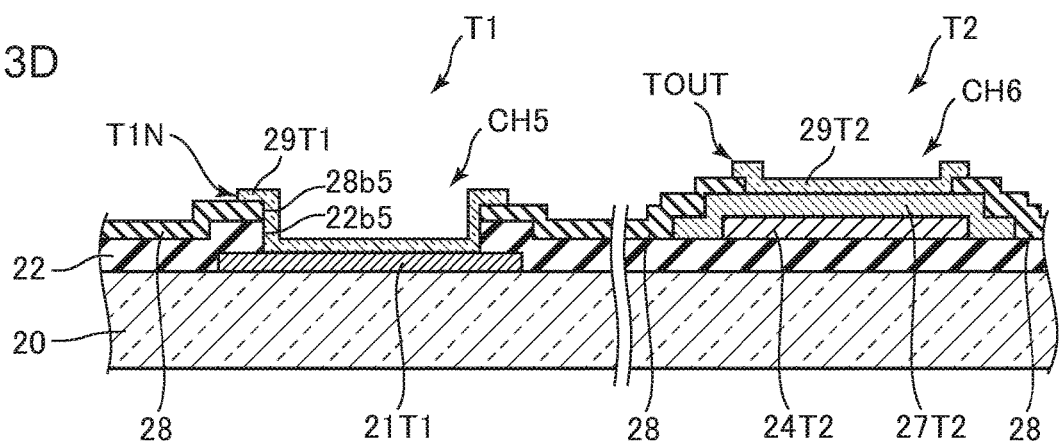

FIGS. 13A to 13D illustrate steps S19 to S23 shown in FIG. 7 in a formation area for an input terminal portion and in a formation area for an output terminal portion on an array substrate in accordance with an embodiment. FIG. 13A illustrates step S19 shown in FIG. 7 in a formation area for the input terminal portion T1 and in a formation area for the output terminal portion T2. FIG. 13B illustrates step S20 shown in FIG. 7 in the formation area for the input terminal portion T1 and in the formation area for the output terminal portion T2. FIG. 13C illustrates steps S21 and S22 shown in FIG. 7 in the formation area for the input terminal portion T1 and in the formation area for the output terminal portion T2. FIG. 13D illustrates step S23 shown in FIG. 7 in the formation area for the input terminal portion T1 and in the formation area for the output terminal portion T2.

In step S11 shown in FIG. 7, for example, the gate electrodes (second electrodes) 21GE, the gate lines (first lines) 21GW, the first lines 21W in the routing lines W, and the input terminal lines (first lines) 21T1 in the input terminal portion T1, all of which are electrodes or wiring in the first metal layer, are formed of the same metal material, in the same step, and by using the first mask. The first mask has patterns for the gate electrodes 21GE, the gate lines 21GW, the first lines 21W in the routing lines W, and the input terminal lines 21T1 in the input terminal portion T1. In step S11, the gate electrodes 21GE, the gate lines 21GW, the first lines 21W in the routing lines W, and the input terminal lines 21T1 in the input terminal portion T1 are formed in patterns of a metal material such as tantalum, molybdenum, aluminum, or an alloy of any of these metals on a glass substrate 20, for example, by sputtering.

Specifically, as shown in FIG. 8A, the gate electrodes 21GE, which will provide parts of the TFTs 40, are formed on the glass substrate 20 in the formation area for the display area DA. The gate lines 21GW (see FIG. 3) are formed of the same metal material and in the same step as the gate electrodes 21GE, on the glass substrate 20 in the formation area for the display area DA by using the first mask.

The first lines 21W in the routing lines W are formed of the same metal material and in the same step as the gate electrodes 21GE, on the glass substrate 20 in the formation area for the routing lines W by using the first mask as shown in FIG. 9A.

The input terminal lines 21T1 are formed of the same metal material and in the same step as the gate electrodes 21GE, on the glass substrate 20 in the formation area for the input terminal portion T1 by using the first mask as shown in FIG. 10A. In step S1, no electrodes and wiring are formed of the same metal material and in the same step as the gate electrodes 21GE, on the glass substrate 20 in the formation area for the output terminal portion T2 as shown in FIG. 10A.

The gate insulating film (first insulating film) 22 is then formed, for example, across the glass substrate 20 in step S12 shown in FIG. 7. The gate insulating film 22 is formed of, for example, an inorganic insulating material such as silicon oxide, silicon nitride, or silicon oxynitride by, for example, CVD (chemical vapor deposition). Since the gate insulating film 22 is formed across the glass substrate 20, no mask needs to be used in step S12.

Specifically, the gate insulating film 22 is formed on the glass substrate 20 in the formation area for the display area DA so as to cover the gate electrodes 21GE and the gate lines GW (FIG. 3) as shown in FIG. 8B. The gate insulating film 22 is formed on the glass substrate 20 in the formation area for the routing lines W so as to cover the first lines 21W as shown in FIG. 9B. The gate insulating film 22 is formed on the glass substrate 20 in the formation area for the input terminal portion T1 so as to cover the input terminal lines 21T1 as shown in FIG. 10B. The gate insulating film 22 is formed on the glass substrate 20 in the formation area for the output terminal portion T2 as shown in FIG. 10B.

Then, in step S13, a semiconductor layer 23, which will provide parts of the TFTs 40, is formed, for example, on the gate insulating film 22 in the formation area for the display area DA by using a second mask as shown in FIGS. 7 and 8B. The second mask has patterns for the semiconductor layer 23. In step S13, the semiconductor layer 23 is formed in a pattern of a semiconductor material such as oxide semiconductor, amorphous silicon, or polysilicon on the gate insulating film 22, for example, by sputtering. Then, source regions are formed on parts of the semiconductor layer 23, and drain regions are formed on other parts of the semiconductor layer 23. No semiconductor layer 23 is formed in the formation area for the routing lines W shown in FIG. 9B, in the formation area for the input terminal portion T1 shown in FIG. 10B, and in the formation area for the output terminal portion T2.

In conventional manufacturing methods, subsequently to the formation of the semiconductor layer, contact holes are made through the gate insulating film using a mask, to form contacts to, for example, the first lines (first metal layer) below the gate insulating film. In contrast, in the present embodiment, the contact holes CH4 and CH5 are collectively formed through the gate insulating film 22 and the second protective film 28 respectively in step S22 (FIGS. 7, 12C, and 13C) to expose the first lines 21W and the input terminal lines 21T1 (first metal layer), which will be described later in detail. Therefore, the present embodiment, unlike conventional manufacturing methods, requires no masks in forming contact holes through the gate insulating film 22.

Then, in step S14 shown in FIG. 7, for example, the source electrodes (first electrodes) 24SE, the drain electrodes (first electrodes) 24DE, the source lines (second lines) 24SW, the second lines 24W in the routing lines W, and the output terminal lines (second lines) 24T2 in the output terminal portion T2, all of which are electrodes or wiring in the second metal layer, are formed of the same metal material, in the same step, and by using the third mask. The third mask has patterns for the source electrodes 24SE, the drain electrodes 24DE, the source lines SW, the second lines 24W, and the output terminal lines 24T2. In step S14, the source electrodes 24SE, the drain electrodes 24DE, the source lines SW, the second lines 24W in the routing lines W, and the output terminal portion T2 are formed in patterns of a metal material such as tantalum, molybdenum, aluminum, or an alloy of any of these metals on the gate insulating film 22, for example, by sputtering. The source electrodes 24SE are formed partially in contact with the source regions in the semiconductor layer 23, and the drain electrodes 24DE are formed in contact with the drain regions in the semiconductor layer 23.

Specifically, as shown in FIG. 8C, in the formation area for the display area DA, the source electrodes 24SE, which will provide parts of the TFTs 40, are formed stretching on the gate insulating film 22 and the source regions in the semiconductor layer 23, and the drain electrodes 24DE, which will provide parts of the TFTs 40, are formed stretching on the gate insulating film 22 and the drain regions in the semiconductor layer 23. The TFTs 40 are thus formed which include the gate electrodes 21GE, the semiconductor layer 23, the source electrodes 24SE, and the drain electrodes 24DE. Meanwhile, the source lines 24SW (see FIG. 3) are formed of the same metal material and in the same step as the source electrodes 24SE and the drain electrodes 24DE, in the display area DA on the gate insulating film 22 by using the third mask.

As shown in FIG. 9C, the second lines 24W in the routing lines W are formed of the same metal material and in the same step as the source electrodes 24SE and the drain electrodes 24DE, on the gate insulating film 22 in the formation area for the routing lines W by using the third mask in such a manner that the second lines 24W overlap the ends of the first lines 21W via the gate insulating film 22. The ends of the second lines 24W thus overlap the ends of the first lines 21W via the gate insulating film 22.

Referring to FIG. 10C, no electrodes and wiring are formed of the same metal material and in the same step as the source electrodes 24SE and the drain electrodes 24DE, on the gate insulating film 22 in the formation area for the input terminal portion T1. In contrast, referring to FIG. 10C, the output terminal lines 24T2 are formed of the same metal material and in the same step as the source electrodes 24SE and the drain electrodes 24DE, on the gate insulating film 22 in the formation area for the output terminal portion T2.

Then, in step S15 shown in FIG. 7, the first protective film (third insulating film) 25 is formed, for example, across the glass substrate 20 on the gate insulating film 22. The first protective film 25 is formed of, for example, an inorganic insulating material such as silicon oxide, silicon nitride, or silicon oxynitride by, for example, CVD (chemical vapor deposition). Since the first protective film 25 is formed across the glass substrate 20 on the gate insulating film 22 in step S15, no mask needs to be used.

Specifically, the first protective film 25 is formed on the gate insulating film 22 in the formation area for the display area DA so as to cover the source lines SW, the drain electrodes 24DE, the exposed parts of the source electrodes SE, and the semiconductor layer 23 (FIG. 3) as shown in FIG. 8D. The TFTs 40 are thus covered by the first protective film 25. In addition, the first protective film 25 is formed on the gate insulating film 22 in the formation area for the routing lines W so as to cover the second lines 24W as shown in FIG. 9D. The first protective film 25 is formed on the gate insulating film 22 in the formation area for the input terminal portion T1 as shown in FIG. 10D. Additionally, the first protective film 25 is formed on the gate insulating film 22 in the formation area for the output terminal portion T2 so as to cover the output terminal lines 24T2 as shown in FIG. 10D.

Then, in step S16 shown in FIG. 7, the planarizing film (fourth insulating film) 26 is formed, for example, on the first protective film 25 using a fourth mask. The fourth mask has patterns for the planarizing film 26 including, for example, contact holes to be formed through the planarizing film 26. The planarizing film 26 is formed in the formation area for the display area DA and parts of the formation area for the surrounding frame region NA, not in the formation area for the terminal section T. The planarizing film 26 is formed by, for example, applying and baking an acrylic-based organic resin material and thereafter subjecting the baked resin to photolithography that involves use of the fourth mask.

Specifically, as shown in FIG. 8D, the planarizing film 26 is formed in the formation area for the display area DA using the fourth mask, so as to cover the first protective film 25. The TFTs 40 is thus covered by the first protective film 25 and the planarizing film 26. Meanwhile, contact holes CH1a are formed through the planarizing film 26 over parts of the drain electrodes 24DE to expose the first protective film 25.

In addition, the planarizing film 26 is formed in the formation area for the routing lines W shown in FIG. 9D using the fourth mask so as to cover the first protective film 25. Contact holes CH2a are thus formed in the formation area for the routing lines W so as to expose the first protective film 25 which is an upper layer for the first lines 21W over the ends of the second lines 24W (parts of the second lines 24W) and over those parts not overlapping the ends of the second lines 24W.

No planarizing film 26 covering the first protective film 25 is formed over the formation area for the input terminal portion T1 and over the formation area for the output terminal portion T2 shown in FIG. 10D by using the fourth mask.

Then, in step S17 shown in FIG. 7, unnecessary parts of the first protective film 25 are collectively removed by etching using, for example, the planarizing film 26 as a mask. Contact holes (second contact holes) are thus formed through parts of the first protective film 25 and parts of the planarizing film 26. In step S17, for example, plasma discharge is generated in a chamber that houses the glass substrate 20 by evacuating the chamber to a vacuum, supplying a flow of a fluorine-based gas into the chamber, and feeding the power supply with a prescribed level of electric power. The first protective film 25 is hence dry-etched to remove unnecessary parts of the first protective film 25 by using the planarizing film 26 as a mask, to form the contact holes (second contact holes) CH1 and the contact holes (second contact holes) CH2 through the first protective film 25 and the planarizing film 26.

Specifically, as shown in FIG. 8E, the parts of the first protective film 25 that are exposed in the contact holes CH1a are removed in the formation area for the display area DA by dry etching from a surface 26a side of the planarizing film 26 while the surface 26a of the planarizing film 26 is exposed. The contact holes CH1 are thus formed through the first protective film 25 and the planarizing film 26. Parts of the drain electrodes 24DE are consequently exposed in the contact holes CH1.

Additionally, as shown in FIG. 9E, the parts of the first protective film 25 that are exposed in the contact holes CH2a are removed by dry etching from the surface 26a side of the planarizing film 26 while the surface 26a of the planarizing film 26 is exposed. The contact holes CH2 are thus formed through the first protective film 25 and the planarizing film 26. The gate insulating film 22 is consequently exposed in the contact holes CH2 over the ends of the second lines 24W (parts of the second lines 24W) and over those parts of the first lines 21W not overlapping the ends of the second lines 24W.

Additionally, as shown in FIG. 10E, the first protective film 25 is removed in the formation area for the input terminal portion T1 and in the formation area for the output terminal portion T2. The gate insulating film 22 is thus exposed around the input terminal lines 21T1 and the input terminal lines 21T1 in the formation area for the input terminal portion T1. The gate insulating film 22 is also exposed around the output terminal lines 24T2 and the output terminal lines 24T2 in the formation area for the output terminal portion T2.

In conventional manufacturing methods, subsequently to the formation of the first protective film, contact holes are formed on the first protective film by using a mask, to form contacts to, for example, the first lines (first metal layer) or the second lines (second metal layer) below the first protective film before a planarizing film is formed on the first protective film. In contrast, in the present embodiment, contact holes are formed through the first protective film 25 below the planarizing film 26 by using the planarizing film 26 as a mask in step S17. Therefore, the present embodiment, unlike conventional manufacturing methods, does not require a separate mask in forming contact holes through the first protective film 25.

In addition, the contact holes CH1 and CH2 are formed by removing unnecessary parts of the first protective film 25 below the planarizing film 26 by etching that involves use of the planarizing film 26 as a mask in this manner. Positional deviations can be hence prevented between the contact holes in the planarizing film 26 and the contact holes in the first protective film 25 in the contact holes CH1. Positional deviations can be also prevented between the contact holes in the planarizing film 26 and the contact holes in the first protective film 25 in the contact holes CH2.

Steps can hence be restrained from developing between an inner wall 25b1 of the first protective film 25 and an inner wall 26b1 of the planarizing film 26 in the contact hole CH1 as shown in FIG. 8E. In other words, the inner wall 25b1 of the first protective film 25 and the inner wall 26b1 of the planarizing film 26, which constitute parts of the inner wall of the contact hole CH1, are formed so as to lie in a single continuous face. Steps can also be restrained from developing between an inner wall 25b2 of the first protective film 25 and an inner wall 26b2 of the planarizing film 26 in the contact hole CH2 as shown in FIG. 9E. In other words, the inner wall 25b2 of the first protective film 25 and the inner wall 26b2 of the planarizing film 26, which constitute parts of the inner wall of the contact hole CH2, are formed so as to lie in a single continuous face.

According to the method of manufacturing the display device 1 in accordance with the present embodiment, the contact holes CH1 and the contact holes CH2 are formed through the first protective film 25 by using the planarizing film 26 as a mask while the surface 26a of the planarizing film 26 is exposed. The surface 26a of the planarizing film 26 may therefore be damaged and become irregular. For this reason, If various wiring (e.g., the third metal layer) is formed on the surface 26a of the planarizing film 26 without doing anything after the contact holes CH1 and the contact holes CH2 are formed, necessary patterns may not precisely formed and/or may come off from the surface 26a of the planarizing film 26.

Accordingly, a process is performed next in step S8 shown in FIG. 7 to smooth out the irregularities in the surface 26a of the planarizing film 26 (planarization). In step S18, for example, plasma discharge is generated in a chamber that houses the glass substrate 20 by evacuating the chamber to a vacuum, supplying a flow of a fluorine-based gas into the chamber, and feeding the power supply with a prescribed level of electric power. This electric power fed to the power supply in generating plasma discharge in step S18 is smaller than the electric power fed to the power supply in generating plasma discharge in step S7 (approximately half). The irregularities in the surface 26a of the planarizing film 26 formed in step S17 are thus smoothed out (planarized) by dry etching.

Specifically, the irregularities in the surface 26a of the planarizing film 26 are planarized around the contact holes CH1 in the formation area for the display area DA by dry etching as shown in FIG. 8E. The irregularities in the surface 26a of the planarizing film 26 are also planarized around the contact holes CH2 in the formation area for the routing lines W by dry etching as shown in FIG. 9E. The irregularities in the surface 26a of the planarizing film 26 are also planarized around the formation area for the input terminal portion T1 and around the formation area for the output terminal portion T2 by dry etching (not shown in FIG. 10E).

Then, in step S19 shown in FIG. 7, for example, a plurality of pixel-region metal patterns (metal patterns in each pixel region, second conductive layer) 27 that will provide the pixel electrodes 27P and the first connecting sections (second conductive layer) 27C1, the touch panel lines (second conductive layer) 27TPW, and the metal covers (second conductive layer) 27C2, 27T2, all of which are electrodes or wiring in the third metal layer, are formed of the same metal material in the same step by using the fifth mask. The fifth mask has patterns for the pixel-region metal patterns 27, the touch panel lines 27TPW, and the metal covers 27C2 and 27T2. In step S19, the pixel-region metal patterns 27, the touch panel lines 27TPW, and the metal covers 27C2 and 27T2 are all formed in patterns each having, for example, a sputtering-formed double layer structure of: a transparent conductive layer composed of, for example, a transparent conductive material such as indium tin oxide (ITO), indium zinc oxide (IZO), zinc oxide (ZnO), or tin oxide (SnO); and a metal layer composed of a metal material such as tantalum, molybdenum, aluminum, or an alloy of any of these metals. The pixel-region metal patterns 27, the touch panel lines 27TPW, and the metal covers 27C2 and 27T2 do not necessarily have a double layer structure and may have a multilayer structure that contains three or more layers.

Specifically, the pixel-region metal patterns 27 are formed using the fifth mask in such a manner that each pixel-region metal pattern 27 is connected from the surface 26a of the planarizing film 26 via the contact hole CH1 to the drain electrode 24DE partially exposed inside the contact hole CH1 in the formation area for the display area DA as shown in FIG. 11A. The touch panel lines 27TPW are formed of the same metal material and in the same step as the pixel-region metal patterns 27, on the surface 26a of the planarizing film 26 by using the fifth mask. On the inner walls of the contact holes CH1, the pixel-region metal patterns 27 are formed so as to cover those parts of the inner walls 25b1 of the first protective film 25 and the inner walls 26b1 of the planarizing film 26 that are formed as single continuous faces.

The metal covers 27C2 are formed of the same metal material and in the same step as the pixel-region metal patterns 27, in the formation area for the routing lines W by using the fifth mask in such a manner that each metal cover 27C2 is connected from the surface 26a of the planarizing film 26 via the contact hole CH2 to the second line 24W partially exposed inside the contact hole CH2, as shown in FIG. 12A. The metal cover 27C2 covers the surface and side faces of the second line 24W exposed on the bottom face of the contact hole CH2. This structure enables the metal cover 27C2 to serve, inside the contact hole CH2, as an etching stopper that prevents the second line 24W, which would be otherwise exposed inside the contact hole CH2, from being etched in the etching process in step S19 and subsequent steps. In other words, the formation of the metal covers 27C2 covering the second lines 24W indie the contact holes CH2 enables the prevention of etching of the second lines 24W.

The metal covers 27T2 are formed in the formation area for the output terminal portion T2 by using the fifth mask in such a manner that each metal cover 27T2 covers the output terminal line 24T2 exposed on the gate insulating film 22, as shown in FIG. 13A. This structure enables the metal cover 27T2 to serve, in the formation area for the output terminal portion T2, as an etching stopper (protective film) that prevents the output terminal line 24T2, which would be otherwise exposed in the formation area for the output terminal portion T2, from being etched in the etching process in step S9 and subsequent steps. In other words, the formation of the metal covers 27T2 covering the output terminal lines 24T2 in the formation area for the output terminal portion T2 enables the prevention of etching of the output terminal lines 24T2.

Since the irregularities in the surface 26a of the planarizing film 26 have been planarized in step S18 described above, the pixel-region metal patterns 27, the touch panel lines 27TPW (FIG. 11A), and the metal covers 27C2 (FIG. 12A) can be formed in step S19 in desirable patterns on the surface 26a of the planarizing film 26 in such a manner as to be prevented from coming off from the surface 26a of the planarizing film 26.

According to the method of manufacturing the display device 1 in accordance with the present embodiment, the contact holes CH1 and CH2 are formed through both the first protective film 25 and the planarizing film 26 by using the planarizing film 26 as a mask as shown in FIG. 8E and FIG. 9E. Those contact holes through the first protective film 25 and through the planarizing film 26 which constitute parts of the contact holes CH1 are therefore free from positional deviations and well aligned as shown in FIG. 8E. For the same reason, those contact holes through the first protective film 25 and through the planarizing film 26 which constitute parts of the contact holes CH2 are free from positional deviations and well aligned as shown in FIG. 9E. Therefore, by forming contact holes through the planarizing film after forming contact holes through the first protective film, steps can be restrained from developing between the inner walls 25b1 of the first protective film 25 and the inner walls 26b1 of the planarizing film 26, which constitute parts of the inner walls of the contact holes CH1 (FIG. 11A), when compared with contact holes being formed through the first protective film and the planarizing film. In other words, the inner walls 25b1 of the first protective film 25 and the inner walls 26b1 of the planarizing film 26, which constitute parts of the inner walls of the contact holes CH1, are formed so as to lie in single continuous faces. For this reason, the structure can prevent the area of the drain electrode 24DE, which is exposed inside the contact hole CH1 in a plan view of the contact hole CH1, from decreasing excessively. Hence, the structure can prevent the area where the drain electrode 24DE is in contact with the pixel-region metal pattern 27 on the bottom face of the contact hole CH1 from decreasing excessively, thereby preventing electrical characteristics from being degraded between the drain electrode 24DE and the pixel-region metal pattern 27.

Likewise, steps can be restrained from developing between the inner walls 25b2 of the first protective film 25 and the inner walls 26b2 of the planarizing film 26, which constitute parts of the inner walls of the contact holes CH2 (FIG. 12A). In other words, the inner walls 25b2 of the first protective film 25 and the inner walls 26b2 of the planarizing film 26, which constitute parts of the inner walls of the contact holes CH2, are formed so as to lie in single continuous faces. For this reason, the structure can prevent the area of the second line 24W, which is exposed inside the contact hole CH2 in a plan view of the contact hole CH2, from decreasing excessively. Hence, the structure can prevent the area where the second line 24W is in contact with the metal cover 27C2 on the bottom face of the contact hole CH2 from decreasing excessively, thereby preventing electrical characteristics from being degraded between the second line 24W and the metal cover 27C2.

Then, in step S20 shown in FIG. 7, the metal layer composed of a metal material on the transparent conductive layer composed of a transparent conductive material that will constitute the pixel electrodes 27P, the metal layer providing parts of the pixel-region metal patterns 27, is removed by, for example, wet etching using a sixth mask. The sixth mask has patterns for the pixel electrodes 27P. The pixel electrodes 27P and the first connecting sections 27C1 are thus formed as shown in FIG. 11B. Neither the metal covers 27C2 in FIG. 12B in the formation area for the routing lines W nor the metal covers 27T2 in FIG. 13B in the formation area for the output terminal portion T2 are etched. Since the second lines 24W inside the contact holes CH2 are covered by the metal covers 27C2 in the formation area for the routing lines W shown in FIG. 12B, the second lines 24W are not etched. Additionally, since the output terminal lines 24T2 are covered by the metal covers 27T2 in the formation area for the output terminal portion T2 shown in FIG. 13B, the output terminal lines 24T2 are not etched.

Then, in step S21 shown in FIG. 7, for example, the second protective film (second insulating film) 28 is formed across the glass substrate 20 on the planarizing film 26. The second protective film 28 is formed of, for example, an inorganic insulating material such as silicon oxide, silicon nitride, or silicon oxynitride by, for example, CVD (chemical vapor deposition). Since the second protective film 28 is formed across the glass substrate 20 on the planarizing film 26 in step S21, no mask needs to be used.

Specifically, the second protective film 28 is formed on the planarizing film 26 in the formation area for the display area DA so as to cover the first connecting sections 27C1, the pixel electrodes 27P, and the touch panel lines 27TPW as shown in FIG. 11C. The second protective film 28 is also formed in the formation area for the routing lines W so as to cover the planarizing film 26 and the contact holes CH2 as shown in FIG. 12C. The second protective film 28 covers the partially exposed gate insulating film 22 and the partially exposed metal covers 27C2 on the bottom faces of the contact holes CH2. The second protective film 28 is formed in the formation area for the input terminal portion T1 so as to cover the gate insulating film 22 on the input terminal lines 21T1 as shown in FIG. 13C. The second protective film 28 is formed in the formation area for the output terminal portion T2 so as to cover the metal covers 27T2 as shown in FIG. 13C.

Then, in step S22 shown in FIG. 7, for example, the contact holes CH3, the contact holes (first contact holes) CH4, the contact holes (first contact holes) CH5, and contact holes CH6 are formed in the same step by, for example, dry etching using a seventh mask. The seventh mask has patterns for the contact holes CH3, the contact holes CH4, the contact holes CH5, and the contact holes CH6. The contact holes CH3 to CH6 are formed in step S22 by, for example, first applying a photoresist that will serve as a mask, dry-etching using the seventh mask to form the contact holes CH3 to CH6, and then removing the photoresist. The dry etching in step S22 may be performed under the same settings and conditions as the dry etching in step S17.

Specifically, as shown in FIG. 11C, the contact holes CH3 are formed through the second protective film 28 by removing the second protective film 28 on parts of the touch panel lines 27TPW in the formation area for the display area DA by dry etching using the seventh mask. The parts of the touch panel lines 27TPW are thus exposed inside the contact holes CH3.

As shown in FIG. 12C, in the formation area for the routing lines W, the second protective film 28 on the metal covers 27C2 and those parts of the second protective film 28 and the gate insulating film 22 in areas where no metal covers 27C2 are formed in the bottom faces of the contact holes CH2 are removed by dry etching using the seventh mask. Hence, the metal covers 27C2 are exposed inside the contact holes CH2, and the contact holes CH4 are collectively formed through those parts of the second protective film 28 and the gate insulating film 22 in areas where no metal covers 27C2 are formed in the bottom faces of the contact holes CH2. The contact holes CH4 are formed in parts of the bottom faces of the contact holes CH2 (where no metal covers 27C2 are formed). Parts of the second lines 24W are exposed in the bottom faces of the contact holes CH4.

Additionally, as shown in FIG. 13C, the gate insulating film 22 and the second protective film 28 on the input terminal lines 21T1 are removed in the formation area for the input terminal portion T1 by dry etching using the seventh mask from a surface 28a side of the second protective film 28. The contact holes CH5 are thus collectively formed through the gate insulating film 22 and the second protective film 28. The input terminal lines 21T1 are exposed on the bottom faces of the contact holes CH5. The ends of the input terminal lines 21T1 are covered by the gate insulating film 22 and the second protective film 28. The second protective film 28 on the metal cover 27T2 is removed in the formation area for the output terminal portion T2 by dry etching using the seventh mask from the surface 28a side of the second protective film 28 as shown in FIG. 13C, to form the contact holes CH6 through the second protective film 28. The metal covers 27T2 are thus exposed inside the contact holes CH6. The ends of the metal covers 27T2 are covered by the second protective film 28.

The contact holes CH4 and CH5 are formed in this manner in step S22, by collectively removing the second protective film 28 and the gate insulating film 22 on parts of the first lines 21W. Therefore, the contact holes CH4 and CH5 can be formed through the second protective film 28 and the gate insulating film 22 using only one mask unlike when the contact holes are formed separately through the two inorganic insulating films. The present embodiment can hence reduce the number of costly masks used in manufacturing the display device 1, thereby reducing the manufacturing cost of the display device 1.

According to the method of manufacturing the display device 1 in accordance with the present embodiment, the second protective film 28 and the gate insulating film 22 are collectively removed by dry etching to form the contact holes CH4 and CH5. Steps can be hence restrained from developing between inner walls 22b4 of the gate insulating film 22 and inner walls 28b4 of the second protective film 28, which constitute parts of the inner walls of the contact holes CH4, as shown in FIG. 12C. In other words, the inner wall 22*b*4 of the gate insulating film 22 and the inner wall 28*b*4 of the second protective film 28, which constitute parts of the inner wall of the contact hole CH4, are formed so as to lie in a single continuous face. Steps can also be restrained from developing between an inner wall 22*b*5 of the gate insulating film 22 and an inner wall 28*b*5 of the second protective film 28, which constitute parts of the inner wall of the contact hole CH5, as shown in FIG. 13C. In other words, the inner wall 22*b*5 of the gate insulating film 22 and the inner wall 28*b*5 of the second protective film 28, which constitute parts of the inner wall of the contact hole CH5, are formed so as to lie in a single continuous face.

Then, in step S23 shown in FIG. 7, for example, the touch panel electrode sections (first conductive layer) 29TP, the second connecting sections (first conductive layer) 29C2, the input terminal pads (first conductive layer) 29T1, and the output terminal pads (first conductive layer) 29T2 are formed of the same metal material, in the same step, and by using an eighth mask. The eighth mask has patterns for the touch panel electrode sections 29TP, the second connecting sections 29C2, the input terminal pads 29T1, and the output terminal pads 29T2. In step S23, the touch panel electrode sections 29TP, the second connecting sections (first conductive layer) 29C2, the input terminal pads (first conductive layer) 29T1, and the output terminal pads 29T2 are formed of, for example, a transparent conductive material such as indium tin oxide (ITO), indium zinc oxide (IZO), zinc oxide (ZnO), or tin oxide (SnO) by, for example, sputtering using the eighth mask.

Specifically, as shown in FIG. 11D, each touch panel electrode section 29TP is formed over some pixel regions Pix in the formation area for the display area DA by using the eighth mask so that the touch panel electrode section 29TP is connected to the touch panel line 27TPW via the contact hole CH3. Specifically, the touch panel electrode section 29TP is in contact with the touch panel line 27TPW which has been exposed in the bottom face of the third contact hole. This completes the formation of the pixel regions Pix in the display area DA.

The second connecting sections 29C2 are formed around the contact holes CH2, inside the contact holes CH2, and inside the contact holes CH4 in the formation area for the routing lines W by using the eighth mask as shown in FIG. 12D. For instance, the second connecting sections 29C2 are formed so as to have a larger area than the contact holes CH2 (FIG. 4). The second connecting sections 29C2 are hence in contact with the metal covers 27C2 on the bottom faces of the contact holes CH2, thereby being electrically connected to the second lines 24W via the metal covers 27C2 and hence coming into contact with the second lines 24W on the bottom faces of the contact holes CH4. This completes the formation of the switching contact sections 9 and the routing lines W. The first lines 21W and the second lines 24W, which are parts of the routing lines W in two different layers, are electrically connected via the switching contact sections 9. Specifically, the second lines 24W are connected to the first lines 21W via the second connecting sections 29C2 and the metal covers 27C2 in the switching contact sections 9.

As described earlier, the inner wall 22*b*4 of the gate insulating film 22 and the inner wall 28*b*4 of the second protective film 28, which constitute parts of the inner wall of the contact hole CH4, are formed as a single continuous face. For this reason, this structure can prevent the area where the first line 21W is in contact with the second connecting section 29C2 on the bottom face of the contact hole CH4 from decreasing excessively, thereby preventing electrical characteristics from being degraded between the first line 21W and the second connecting section 29C2.

The input terminal pads 29T1 are formed inside the contact holes CH5 and on the second protective film 28 around the contact holes CH5 in the formation area for the input terminal portion T1 by using the eighth mask as shown in FIG. 13D. The input terminal pads 29T1 are thus in contact with the input terminal lines 21T1 which have been exposed on the bottom faces of the contact holes CH5. This completes the formation of the input terminal portion T1. The output terminal pads 29T2 are formed inside the contact holes CH6 and on the second protective film 28 around the contact holes CH6 in the formation area for the output terminal portion T2 as shown in FIG. 13D. The output terminal pads 29T2 are thus in contact with the metal covers 27T2 which have been exposed on the bottom faces of the contact holes CH6 via the contact holes CH6. The output terminal pads 29T2 are thus electrically connected to the output terminal lines 24T2 via the metal covers 27T2. This completes the formation of the output terminal portion T2.

As described earlier, the inner wall 22*b*5 of the gate insulating film 22 and the inner wall 28*b*5 of the second protective film 28, which constitute parts of the inner wall of the contact hole CH5, are formed as a single continuous face. For this reason, this structure can prevent the area where the input terminal line 21T1 is in contact with the input terminal pad 29T1 on the bottom face of the contact hole CH5 from decreasing excessively, thereby preventing electrical characteristics from being degraded between the input terminal line 21T1 and the input terminal pad 29T1.

According to the display device 1 in accordance with the present embodiment, the inner wall 25*b*1 of the first protective film 25 and the inner wall 26*b*1 of the planarizing film 26, which constitute parts of the inner wall of the contact hole CH1 (FIG. 1*i* D), form a single continuous face as described here. For this reason, the structure can prevent the area where the drain electrode 24DE is in contact with the pixel-region metal pattern 27 on the bottom face of the contact hole CH1 from decreasing excessively, thereby preventing electrical characteristics from being degraded between the drain electrode 24DE and the pixel-region metal pattern 27. Specifically, the structure can prevent electrical characteristics from being degraded between the drain electrode 24DE and the pixel electrode 27P connected via the first connecting section 27C1.

The inner wall 25*b*2 of the first protective film 25 and the inner wall 26*b*2 of the planarizing film 26, which constitute parts of the inner wall of the contact hole CH2 (FIG. 12D), form a single continuous face. For this reason, the structure can prevent the area where the second line 24W is in contact with the metal cover 27C2 on the bottom face of the contact hole CH2 from decreasing excessively, thereby preventing electrical characteristics from being degraded between the second line 24W and the metal cover 27C2.

The inner wall 22*b*4 of the gate insulating film 22 and the inner wall 28*b*4 of the second protective film 28, which constitute parts of the inner wall of the contact hole CH4 (FIG. 12D), are formed as a single continuous face. For this reason, the structure can prevent the area where the first line 21W is in contact with the second connecting section 29C2 on the bottom face of the contact hole CH4 from decreasing excessively, thereby preventing electrical characteristics from being degraded between the first line 21W and the second connecting section 29C2.

The inner wall 22*b*5 of the gate insulating film 22 and the inner wall 28*b*5 of the second protective film 28, which constitute parts of the inner wall of the contact hole CH5

(FIG. 13D), are formed as a single continuous face. For this reason, the structure can prevent the area where the-input terminal line 21T1 is in contact with the input terminal pad 29T1 on the bottom face of the contact hole CH5 from decreasing excessively, thereby preventing electrical characteristics from being degraded between the input terminal line 21T1 and the input terminal pad 29T1.

According to the display device 1 in accordance with the present embodiment, the irregularities produced in the surface 26a of the planarizing film 26 in step S18 are planarized in step S19. This arrangement enables various electrodes and wiring on the surface 26a of the planarizing film 26, such as the first connecting sections 27C1, the pixel electrodes 27P, and the touch panel lines 27TPW in FIG. 11D and the metal covers 27C2 in FIG. 12D, which are all formed on the surface 26a of the planarizing film 26, to be formed in desirable patterns in such a manner as to be prevented from coming off from the surface of the surface 26a of the planarizing film 26.

As described earlier, according to the display device 1 in accordance with the present embodiment, since the contact holes CH4 and CH5 (FIGS. 12C and 13 C) are formed in step S22 by collectively removing the gate insulating film 22 and the second protective film 28, the mask for patterning only the gate insulating film 22 out of the gate insulating film 22 and the second protective film 28 can be decreased.

According to the display device 1 in accordance with the present embodiment, contact holes are formed through the first protective film 25 in step S17 by using the planarizing film 26 as a mask. As a result of this, the contact holes CH1 and CH2 (FIG. 8E and FIG. 9E) are formed through the planarizing film 26 and the first protective film 25. Therefore, the mask for patterning only the first protective film 25 out of the planarizing film 26 and the first protective film 25 can be decreased.

This can reduce manufacturing cost when compared with the conventional method of manufacturing a display device. For instance, the conventional method of manufacturing a display device needs 10 masks, whereas the method of manufacturing the display device 1 in accordance with the present embodiment uses eight masks.

The present invention is not limited to the description of the embodiments and examples above. Any structure detailed in the embodiments may be replaced by a practically identical structure, a structure that achieves the same effect and function, or a structure that achieves the same purpose.

What is claimed is:

1. A method of manufacturing a display device, the method comprising:
    forming first lines;
    forming a first insulating film covering the first lines;
    forming a second insulating film covering exposed parts of the first insulating film;
    collectively forming first contact holes through the first insulating film and the second insulating film so as to expose parts of the first lines;
    forming a first conductive layer to be connected to the exposed parts of the first lines via the first contact holes;
    forming second lines on the first insulating film;
    forming a second conductive layer covering exposed parts of the second lines;
    forming a third insulating film covering the second lines;
    forming a fourth insulating film covering the third insulating film; and
    removing parts of the third insulating film and parts of the fourth insulating film to expose parts of the second lines,
    wherein the first lines are exposed inside the first contact holes,
    the first contact holes are collectively formed through parts of the second insulating film and the first insulating film in areas where no second conductive layer is formed in bottom faces of the first contact holes, and
    the first conductive layer is in contact with the first lines on the bottom faces of the first contact holes, thereby being electrically connected to the second lines via the second conductive layer.

2. The method according to claim 1, wherein the first conductive layer is formed in contact with the second conductive layer to connect the first lines and the second lines via the first conductive layer and the second conductive layer.

3. The method according to claim 1, further comprising forming terminal pads comprising a conductive material so as to cover parts of the second conductive layer, wherein the terminal pads, the second conductive layer, and the second lines provide terminals for a terminal section of an array substrate on which an array of TFTs is provided, a circuit being mounted to the terminal section.

4. The method according to claim 1, wherein:
    the second conductive layer includes a transparent conductive layer comprising a transparent conductive material and a third conductive layer stacked on the transparent conductive layer,
    the method further comprising removing parts of the third conductive layer in the second conductive layer to form pixel electrodes comprising the transparent conductive layer.

5. The method according to claim 1, further comprising, after removing the parts of the third insulating film and the parts of the fourth insulating film, planarizing a surface of the fourth insulating film.

* * * * *